US012672570B2

(12) United States Patent
Tanikawa

(10) Patent No.: US 12,672,570 B2
(45) Date of Patent: Jun. 30, 2026

(54) SEMICONDUCTOR DEVICE

(71) Applicant: ROHM CO., LTD., Kyoto (JP)

(72) Inventor: Kohei Tanikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 390 days.

(21) Appl. No.: 18/532,652

(22) Filed: Dec. 7, 2023

(65) Prior Publication Data

US 2024/0105578 A1     Mar. 28, 2024

Related U.S. Application Data

(63) Continuation of application No. PCT/JP2022/027807, filed on Jul. 15, 2022.

(30) Foreign Application Priority Data

Aug. 10, 2021     (JP) ................................. 2021-130765

(51) Int. Cl.
H01L 23/498          (2006.01)
H01L 23/00          (2006.01)
          (Continued)

(52) U.S. Cl.
CPC ....... *H10W 70/658* (2026.01); *H10W 70/685* (2026.01); *H10W 90/00* (2026.01);
          (Continued)

(58) Field of Classification Search
CPC . H10W 70/658; H10W 70/685; H10W 90/00; H10W 90/794; H10W 90/752;
          (Continued)

(56) References Cited

U.S. PATENT DOCUMENTS

| | | | | |
|---|---|---|---|---|
| 5,347,158 | A | * | 9/1994 | Matsuda ............. H10W 44/501 |
| | | | | 257/691 |
| 2012/0256194 | A1 | * | 10/2012 | Yoshihara ........... H10W 70/658 |
| | | | | 257/77 |

(Continued)

FOREIGN PATENT DOCUMENTS

| | | |
|---|---|---|
| JP | 2015-220382 | 12/2015 |
| WO | 2022/030244 | 2/2022 |

OTHER PUBLICATIONS

International Search Report issued in International Application No. PCT/2022/027807, Sep. 27, 2022, 2 pages.

(Continued)

*Primary Examiner* — Peniel M Gumedzoe
(74) *Attorney, Agent, or Firm* — HSML P.C.

(57) ABSTRACT

A semiconductor device includes a conductive substrate, first semiconductor elements and a first conductive member. The substrate includes an obverse surface facing in thickness direction. The first semiconductor elements, bonded to the obverse surface, have a switching function. The conductive member includes a first wiring extending in x direction orthogonal to thickness direction; a second wiring spaced from the first wiring in y direction orthogonal to thickness and x directions, extending in x direction; a third wiring connected to the first wiring and the second wiring, extending in y direction, and connected to the first semiconductor elements; a fourth wiring spaced from the third wiring in x direction, connected to the first wiring and the second wiring, and extending in y direction; and a fifth wiring between the first wiring and the second wiring in y direction and connected to the third wiring and the fourth wiring.

17 Claims, 20 Drawing Sheets

(51) Int. Cl.

| | |
|---|---|
| *H01L 25/065* | (2023.01) |
| *H10W 70/65* | (2026.01) |
| *H10W 70/685* | (2026.01) |
| *H10W 90/00* | (2026.01) |
| *H10W 74/00* | (2026.01) |

(52) U.S. Cl.
CPC .......... *H10W 74/00* (2026.01); *H10W 90/752* (2026.01); *H10W 90/755* (2026.01); *H10W 90/792* (2026.01); *H10W 90/794* (2026.01)

(58) Field of Classification Search
CPC .. H10W 90/792; H10W 90/755; H10W 74/00
See application file for complete search history.

(56) References Cited

U.S. PATENT DOCUMENTS

| | | | | |
|---|---|---|---|---|
| 2013/0015496 A1* | 1/2013 | Konno | ................ | H10W 72/50 |
| | | | | 257/140 |
| 2021/0013183 A1* | 1/2021 | Okaura | .............. | H10W 40/255 |

OTHER PUBLICATIONS

Written Opinion issued in International Application No. PCT/2022/027807, Sep. 27, 2022, 3 pages.

\* cited by examiner

SEMICONDUCTOR DEVICE

TECHNICAL FIELD

The present disclosure relates to semiconductor devices.

BACKGROUND ART

Conventionally, semiconductor devices provided with power switching elements, such as metal-oxide-semiconductor field-effect transistors (MOSFETs) and insulated gate bipolar transistors (IGBT), have been known. These semiconductor devices are used in various electronics, ranging from industrial devices to home appliances and information terminals, or even to vehicle-mount devices. JP-A-2015-220382 discloses a conventional semiconductor device (power module). The semiconductor device disclosed in JP-A-2015-220382 includes a semiconductor element and a supporting substrate. The semiconductor element is an IGBT made of silicon (Si), for example. The supporting substrate supports the semiconductor element. The supporting substrate includes an insulating base and s conductive layer disposed on each of the obverse surface and the reverse surface of the base. The base is made of a ceramic material, for example. The conductive layers are made of copper (Cu), for example. The semiconductor element is bonded to one of the conductive layers.

DETAILED DESCRIPTION OF EMBODIMENTS

Figure 1:
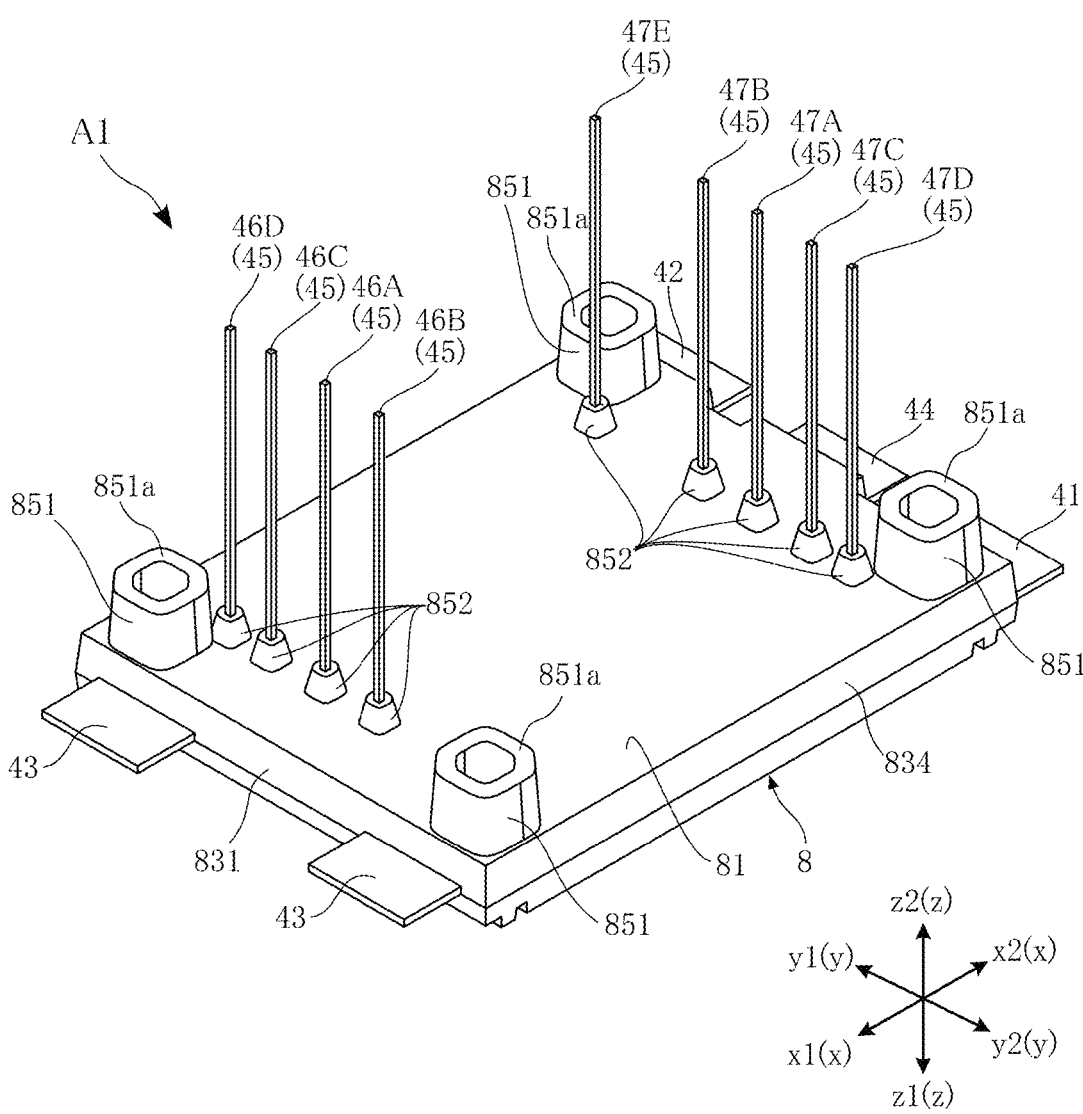
FIG. 1 is a perspective view of a semiconductor device according to a first embodiment of the present disclosure.

Hereinafter, preferred embodiments of the present disclosure will be specifically described with reference to the drawings.

In the description of the present disclosure, the terms "first", "second", "third", and so on are used merely as labels and are not intended define any specific order of the objects referred to by the terms.

In the description of the present disclosure, the expression "An object A is formed in an object B", and "An object A is formed on an object B" include, unless otherwise specifically noted, the situation where the object A is formed directly in or on the object B, and the situation where the object A is formed in or on the object B, with something else interposed between the object A and the object B. Likewise, the expression "An object A is arranged in an object B", and "An object A is arranged on an object B" include, unless otherwise specifically noted, the situation where the object A is arranged directly in or on the object B, and the situation where the object A is arranged in or on the object B, with something else interposed between the object A and the object B. Further, the expression "An object A is located on an object B" includes, unless otherwise specifically noted, the situation where the object A is located on the object B, in contact with the object B, and the situation where the object A is located on the object B, with something else interposed between the object A and the object B. Still further, the expression "An object A overlaps with an object B as viewed in a certain direction" includes, unless otherwise specifically noted, the situation where the object A overlaps with the entire object B, and the situation where the object A overlaps with a part of the object B.

FIGS. 1 to 18 show a semiconductor device according to a first embodiment of the present disclosure. A semiconductor device A1 of the present embodiment includes a plurality of first semiconductor elements 10A, a plurality of second semiconductor elements 10B, a conductive substrate 2, a supporting substrate 3, a first terminal 41, a second terminal 42, a plurality of third terminals 43, a fourth terminal 44, a plurality of control terminals 45, a control-terminal supporting structure 48, a first conductive member 5, a second conductive member 6, and a sealing resin 8.

Figure 2:
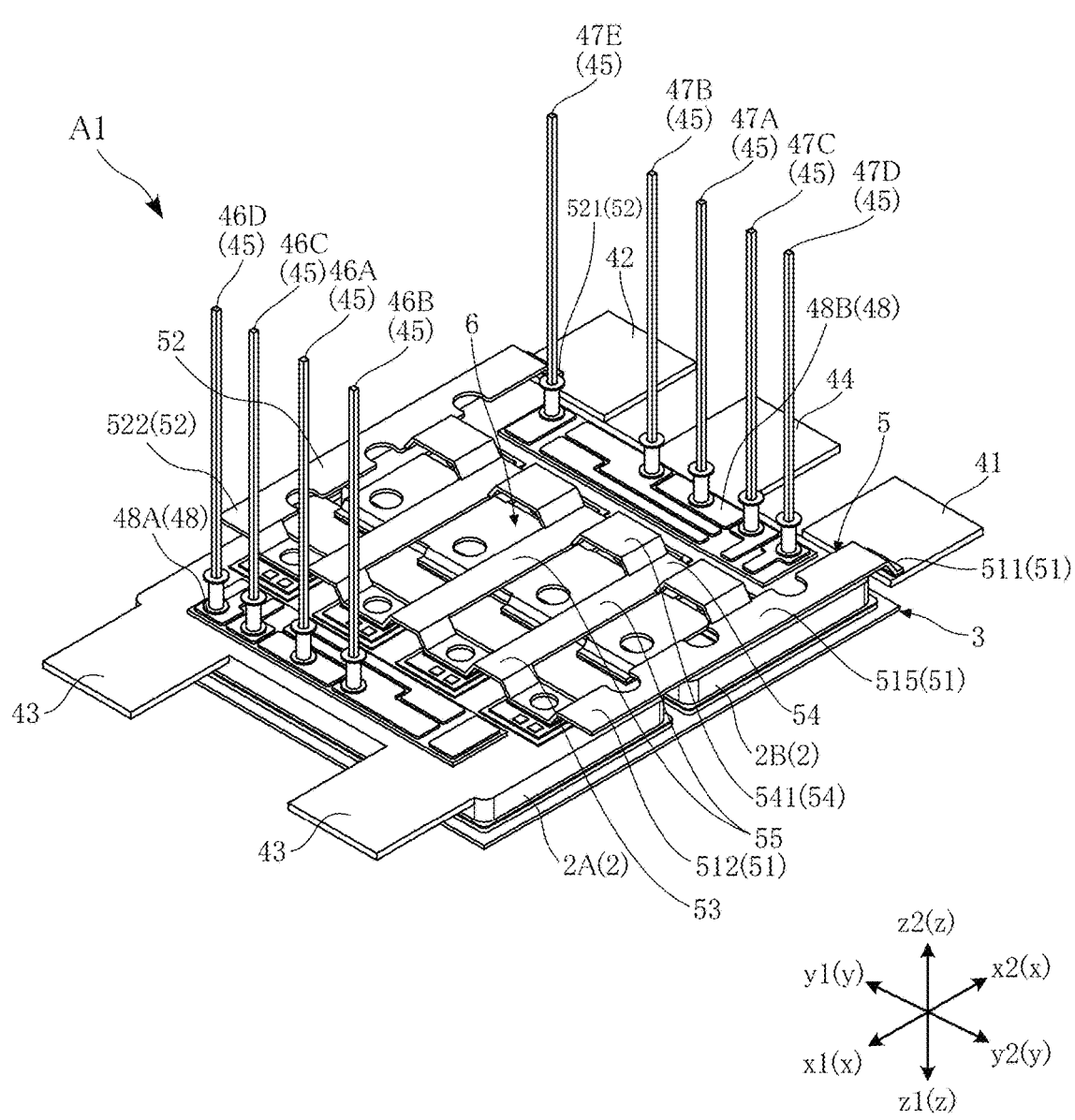
FIG. 2 is a perspective view similar to FIG. 1 with a sealing resin omitted.
Figure 3:
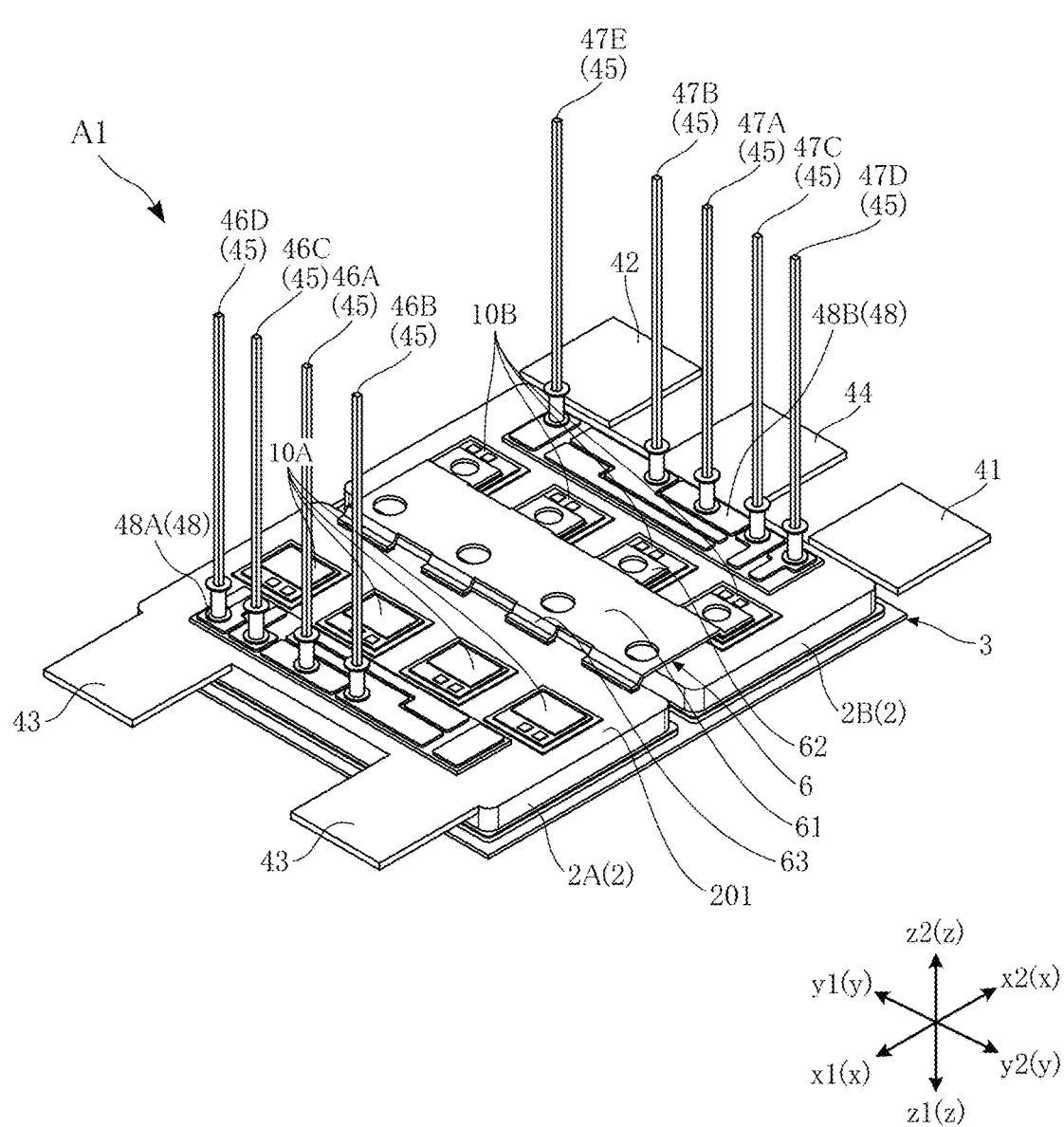
FIG. 3 is a perspective view similar to FIG. 2 with a first conductive member omitted.
Figure 4:
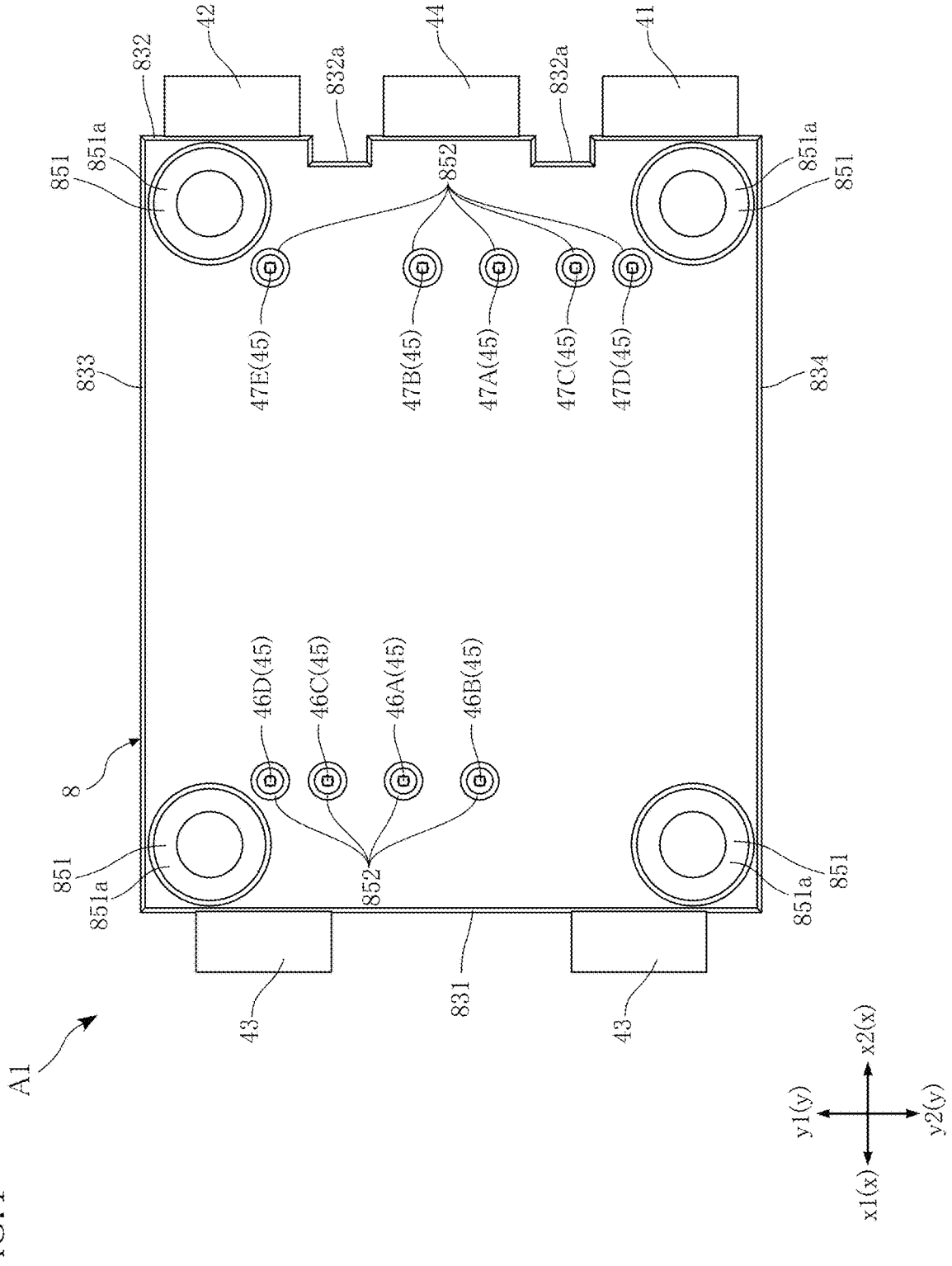
FIG. 4 is a plan view of the semiconductor device shown in FIG. 1.
Figure 5:
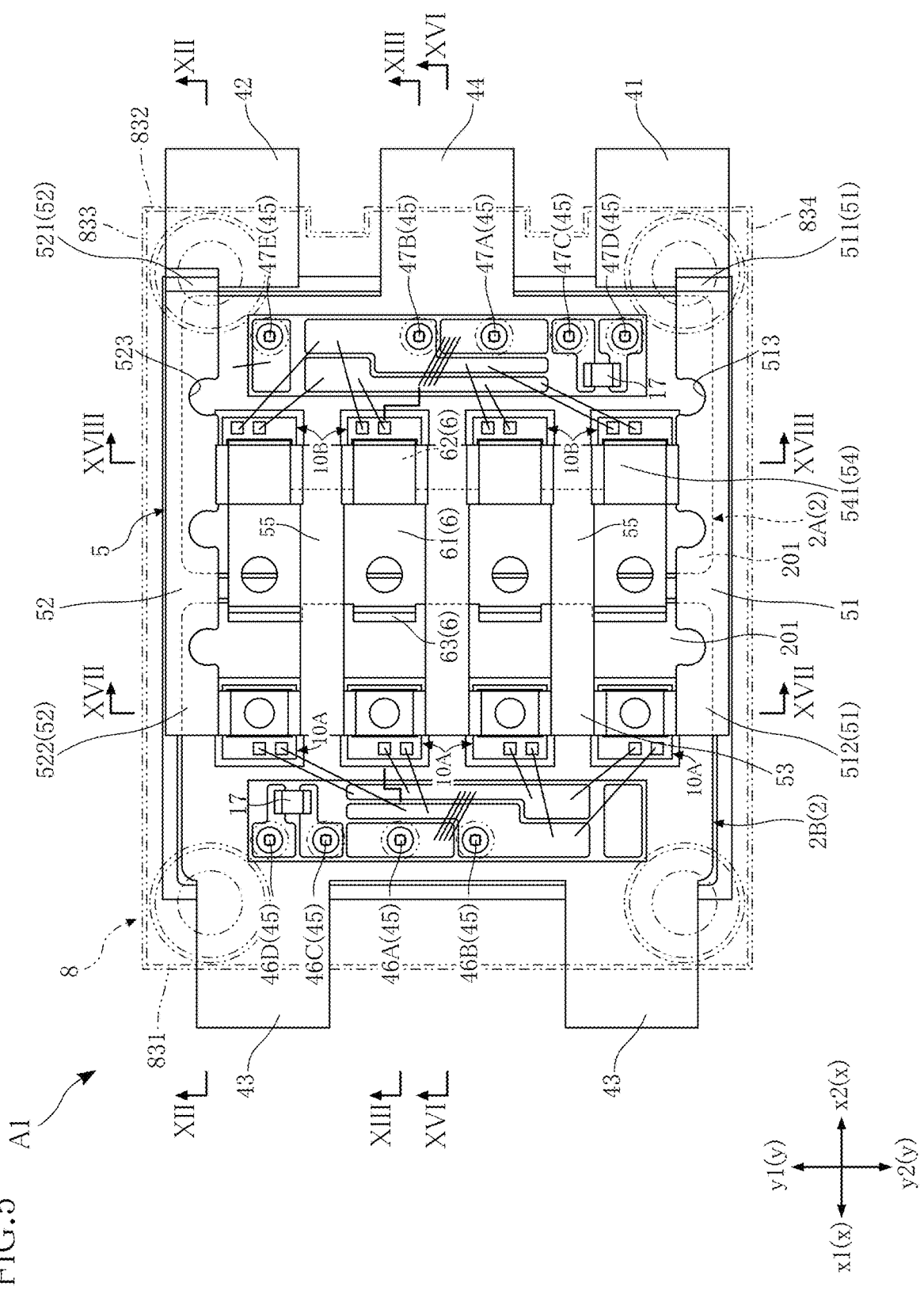
FIG. 5 is a plan view similar to FIG. 4 with the sealing resin indicated by an imaginary line.
Figure 6:
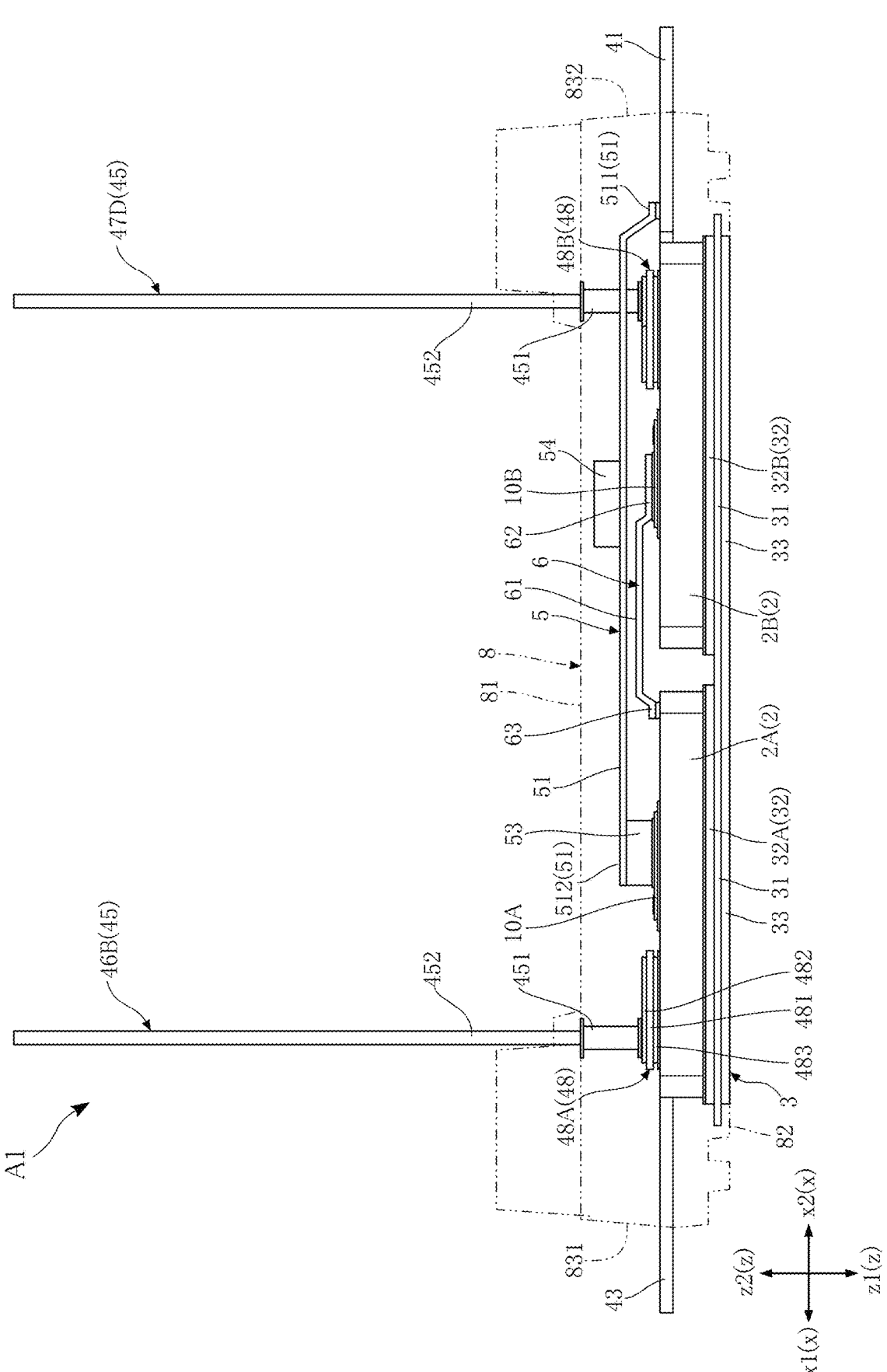
FIG. 6 is a right-side view of the semiconductor device shown in FIG. 1 with the sealing resin indicated by an imaginary line.
Figure 7:
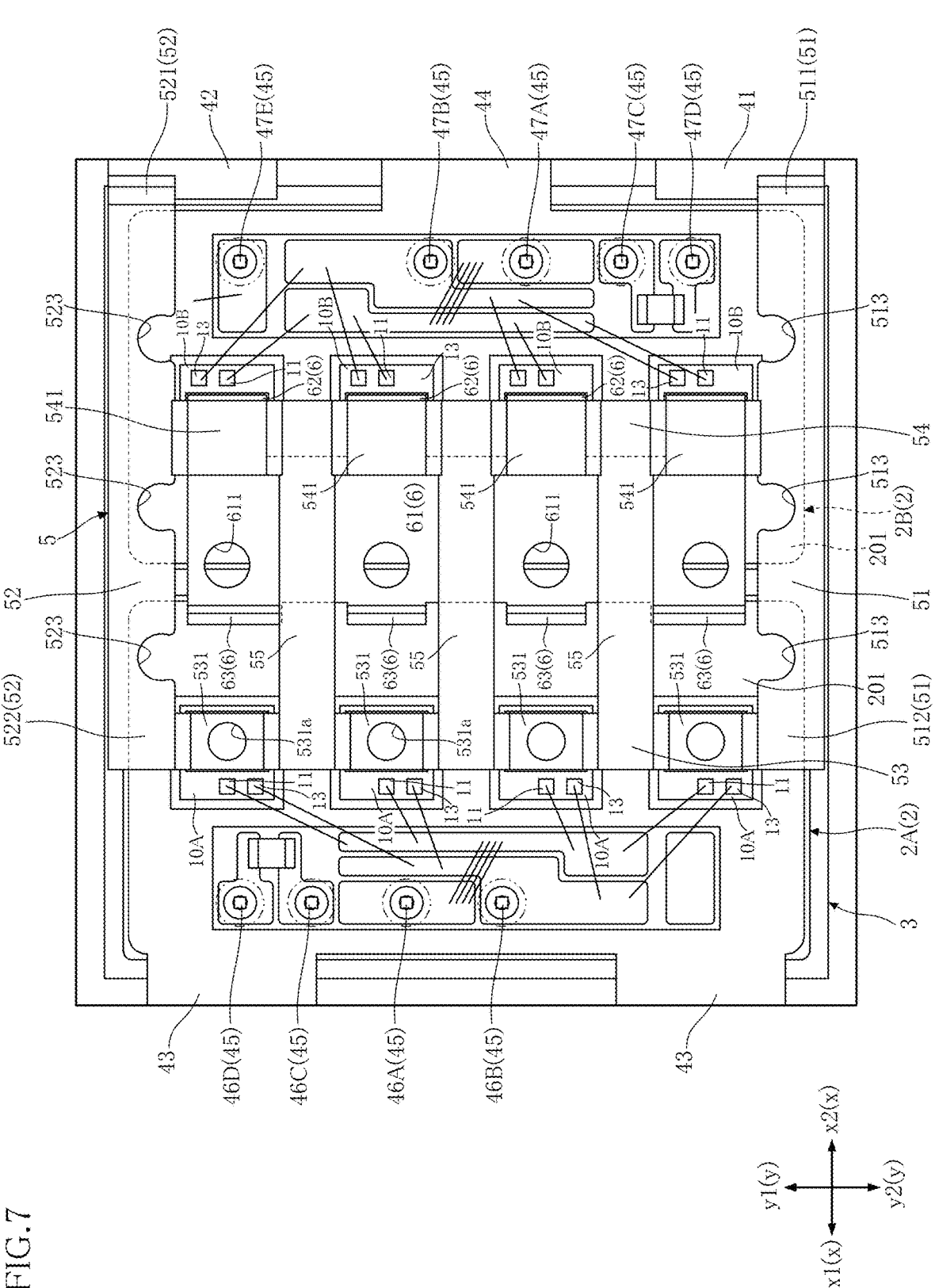
FIG. 7 is an enlarged view showing a portion of FIG. 5 with the sealing resin omitted.
Figure 8:
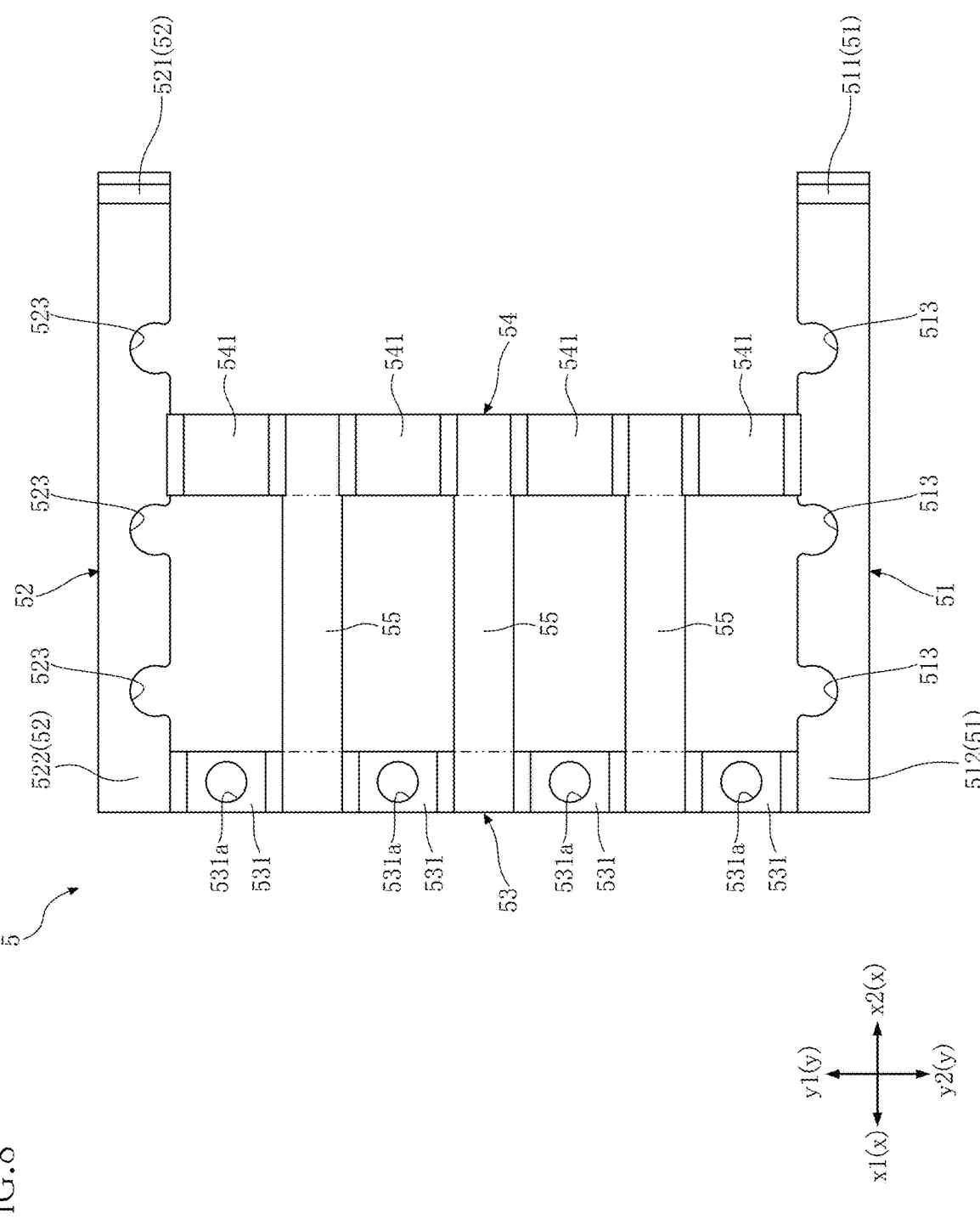
FIG. 8 is a plan view of the first conductive member.
Figure 9:
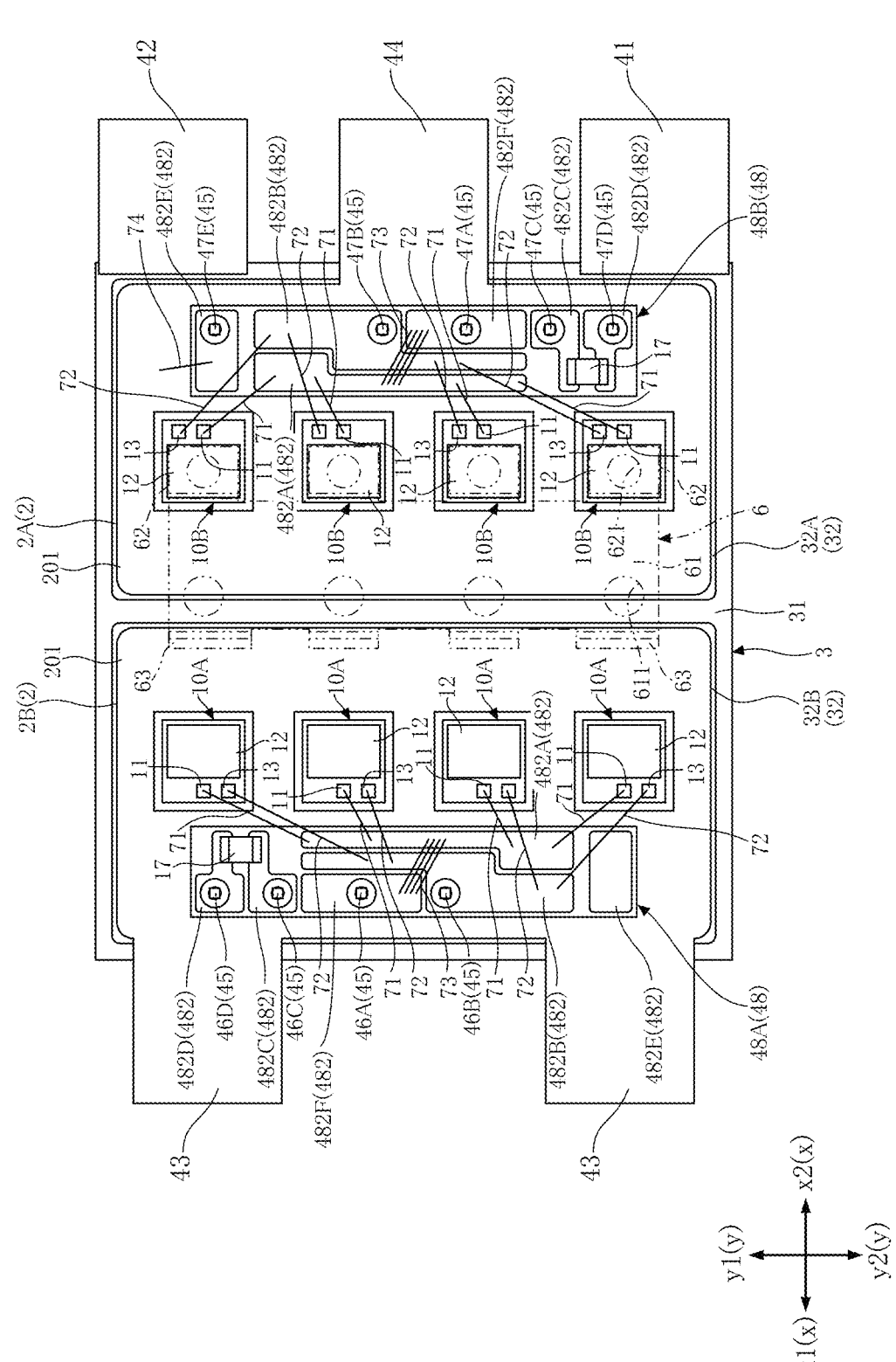
FIG. 9 is a plan view similar to FIG. 5 with the sealing resin and the first conductive member omitted and a second conductive member indicated by an imaginary line.
Figure 10:
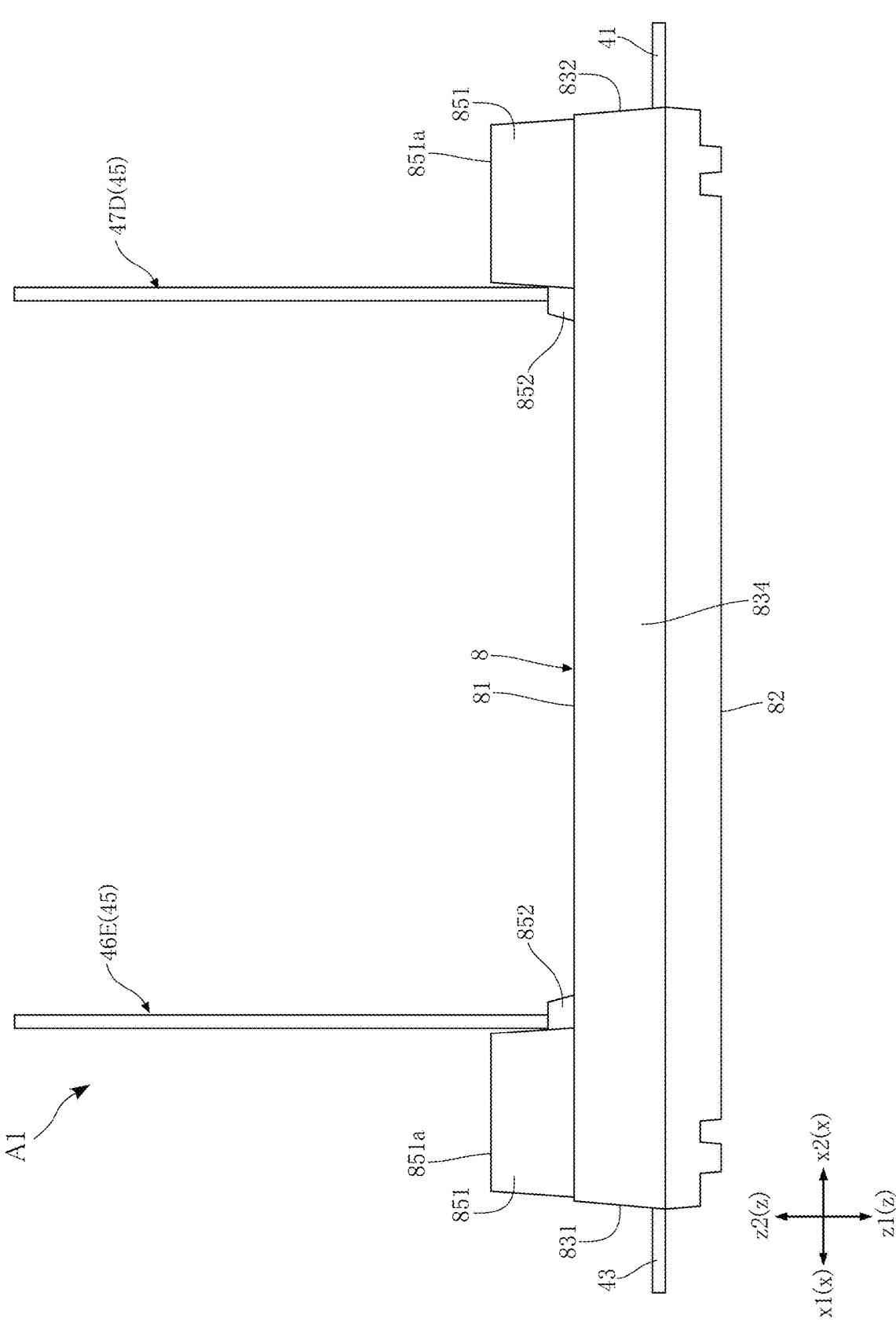
FIG. 10 is a right-side view of the semiconductor device shown in FIG. 1.
Figure 11:
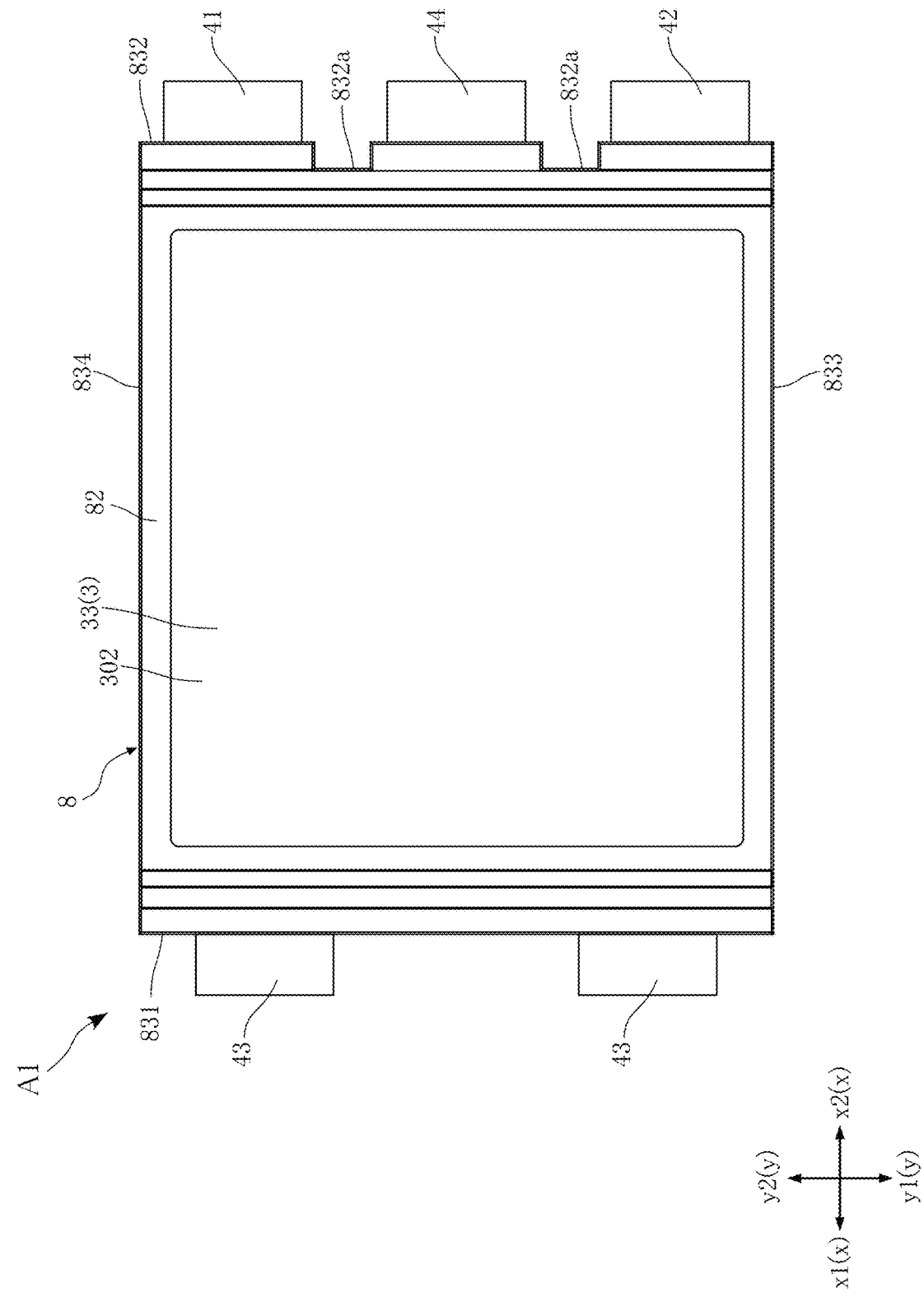
FIG. 11 is a bottom view of the semiconductor device shown in FIG. 1.
Figure 12:
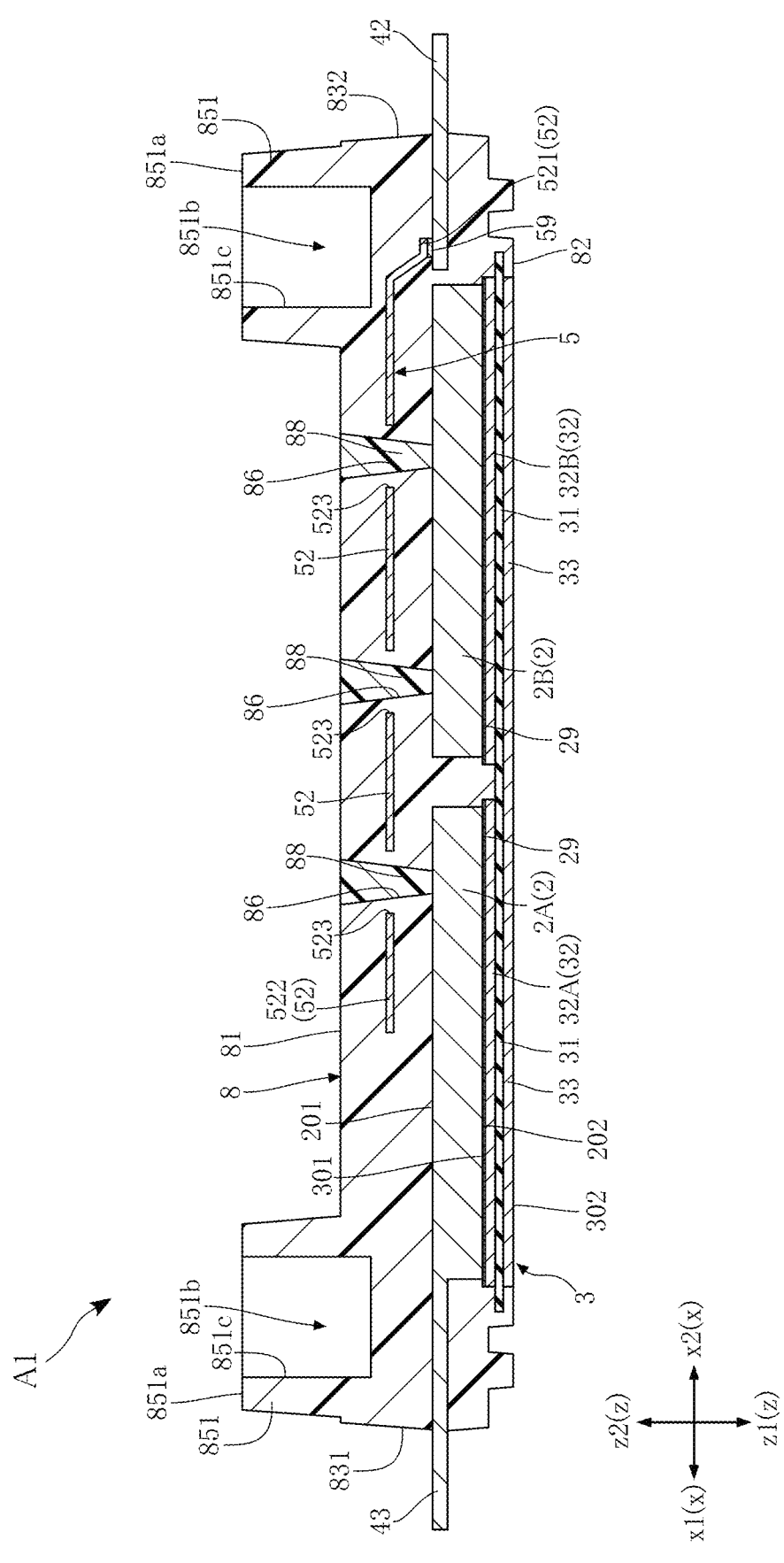
FIG. 12 is a sectional view taken along line XII-XII in FIG. 5.
Figure 13:
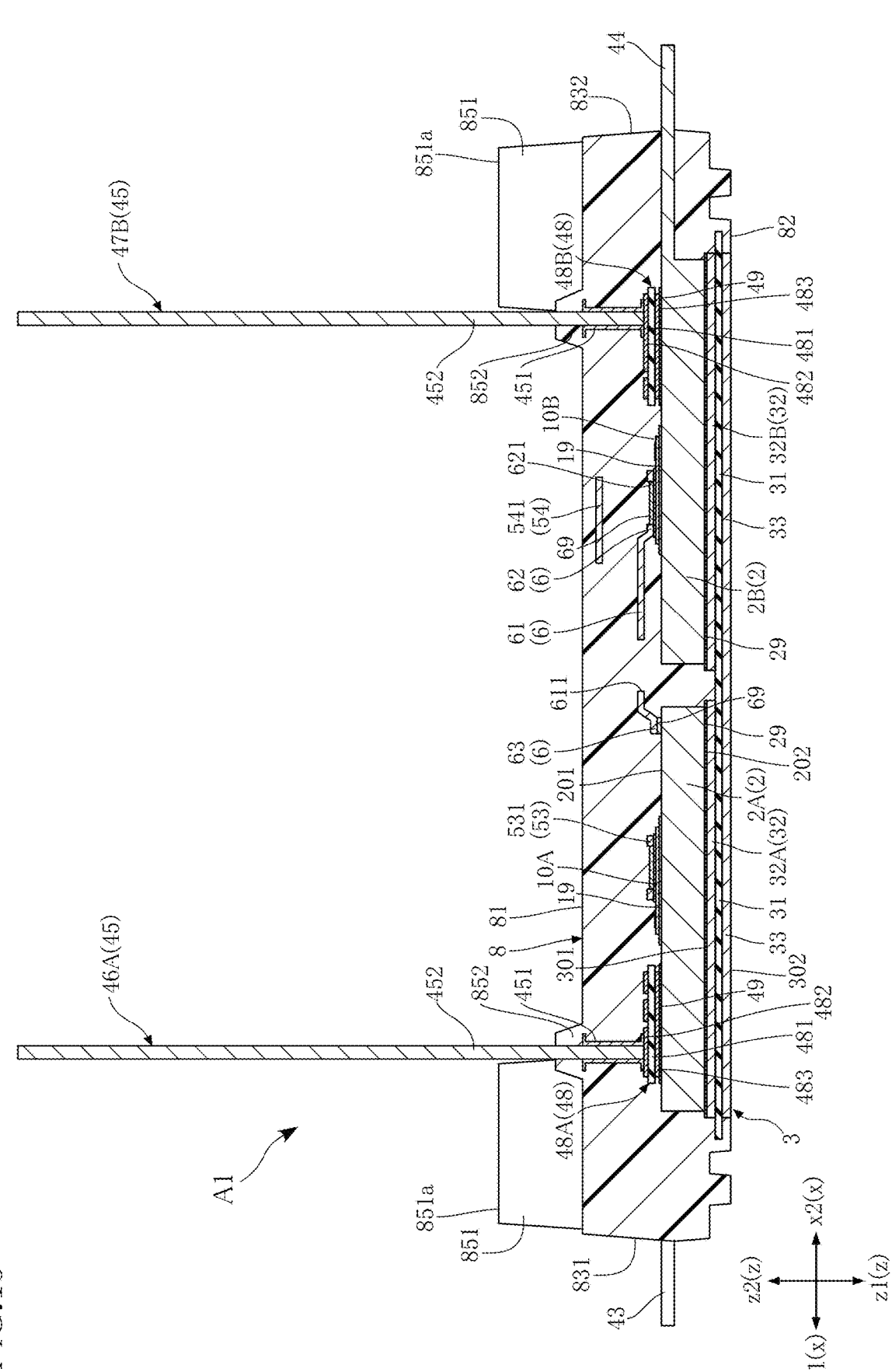
FIG. 13 is a sectional view taken along line XIII-XIII in FIG. 5.
Figure 14:
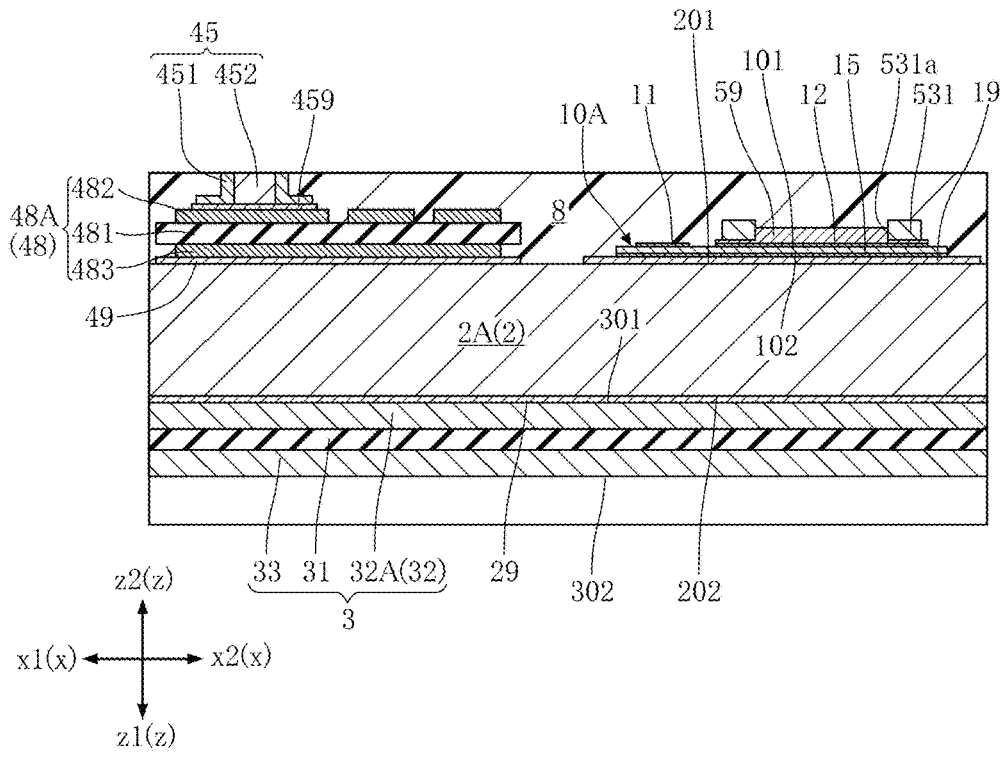
FIG. 14 is an enlarged view showing a portion of FIG. 13.
Figure 15:
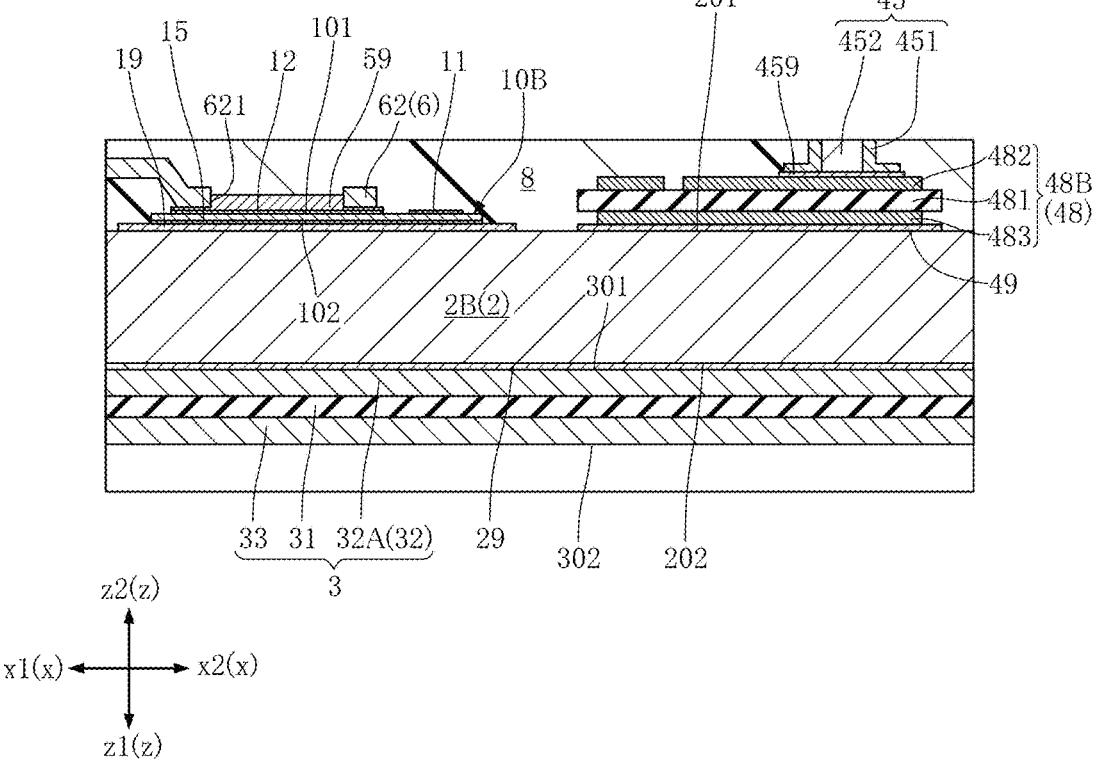
FIG. 15 is an enlarged view showing a portion of FIG. 13.
Figure 16:
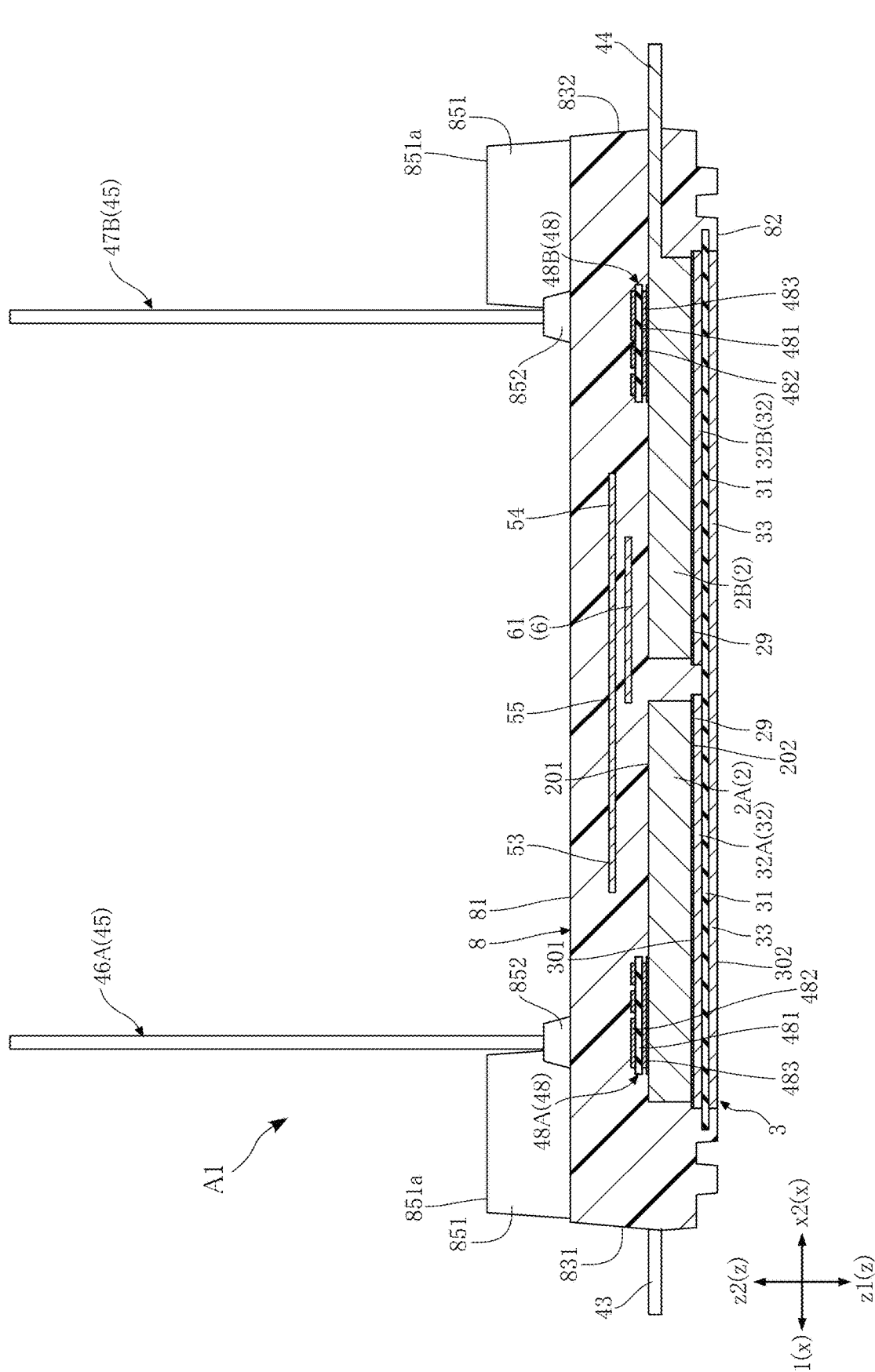
FIG. 16 is a sectional view taken along line XVI-XVI in FIG. 5.
Figure 17:
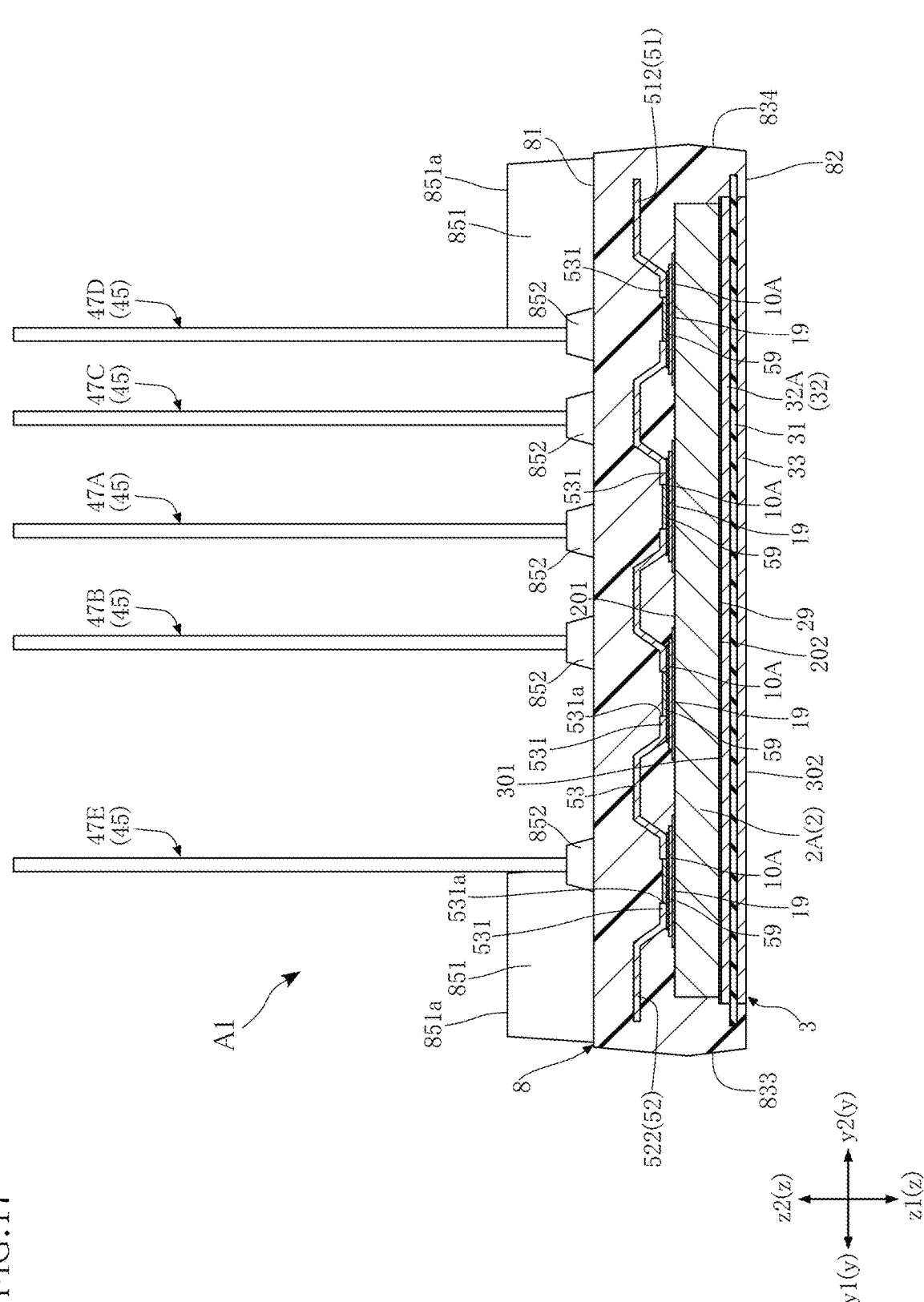
FIG. 17 is a sectional view taken along line XVII-XVII in FIG. 5.
Figure 18:
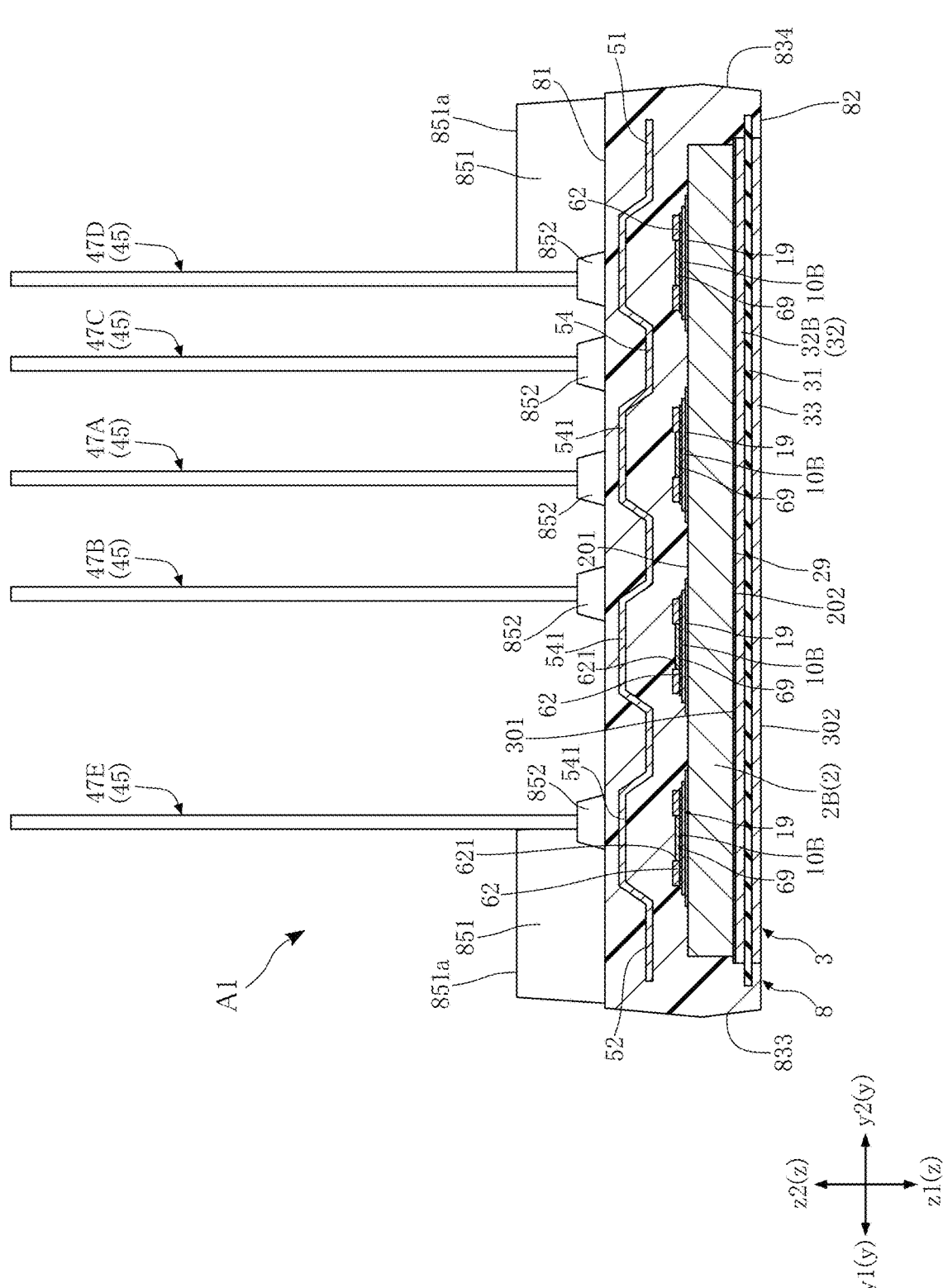
FIG. 18 is a sectional view taken along line XVIII-XVIII in FIG. 5.

FIG. 1 is a perspective view of the semiconductor device A1. FIG. 2 is a perspective view similar to the FIG. 1 with the sealing resin 8 omitted. FIG. 3 is a perspective view similar to the FIG. 2 with the first conductive member 5 omitted. FIG. 4 is a plan view of the semiconductor device A1. FIG. 5 is a plan view similar to the FIG. 4 with the sealing resin 8 indicated by an imaginary line. FIG. 6 is a right-side view of the semiconductor device shown in FIG. 1, with the sealing resin 8 indicated by an imaginary line. FIG. 7 is an enlarged view showing a portion of FIG. 5 with the sealing resin 8 omitted. FIG. 8 is a plan view of the first conductive member 5. FIG. 9 is a plan view similar to FIG. with the sealing resin 8 and the first conductive member 5 omitted and the second conductive member 6 indicated by an imaginary line. FIG. 10 is a right-side view of the semiconductor device shown in FIG. 1. FIG. 11 is a bottom view of the semiconductor device shown in FIG. 1. FIG. 12 is a sectional view taken along line XII-XII in FIG. 5. FIG. 13 is a sectional view taken along line XIII-XIII in FIG. 5. FIGS. 14 and 15 are enlarged views showing a portion of FIG. 13. FIG. 16 is a sectional view taken along line XVI-XVI in FIG. 5. FIG. 17 is a sectional view taken along line XVII-XVII in FIG. 5. FIG. 18 is a sectional view taken along line XVIII-XVIII in FIG. 5.

For the convenience of description, three mutually orthogonal directions (x, y and z directions) are used as references. For example, the z direction is the thickness direction of the semiconductor device A1. The x direction is the horizontal direction of the semiconductor device A1 in the plan view (see FIG. 4). The y direction is the vertical direction of the semiconductor device A1 in the plan view (see FIG. 4). In the following description, "in plan view" refers to the view as seen in the z direction. The x direction is one example of the "first direction", and the y direction is an example of the "second direction".

The first semiconductor elements 10A and the second semiconductor elements 10B are electronic components integral to the function of the semiconductor device A1. The first semiconductor elements 10A and the second semiconductor elements 10B are made of a semiconductor material, which mainly is silicon carbide (SiC). The semiconductor material is not limited to SiC, and other examples include silicon (Si), gallium arsenide (GaAs), and diamond (C). Each of the first semiconductor elements 10A and the second semiconductor elements 10B is a power semiconductor chip having a switching function, such as a metal-oxide-semiconductor field-effect transistor (MOSFET). Although MOSFETs are used in the present embodiment as the first semiconductor elements 10A and the second semiconductor elements 10B, other types of transistors, such as insulated gate bipolar transistors (IGBTs), may also be used. The first semiconductor elements 10A and the second semiconductor elements 10B are all the same type of elements. The first semiconductor elements 10A and the second semiconductor elements 10B are n-channel MOSFETs, but may alternatively be p-channel MOSFETs.

As shown in FIGS. 14 and 15, each of the first semiconductor elements 10A and the second semiconductor elements 10B has an element obverse surface 101 and an element reverse surface 102. For each of the first semiconductor elements 10A and the second semiconductor elements 10B, the element obverse surface 101 and the element reverse surface 102 are spaced apart in the z direction. The element obverse surface 101 faces in the z2 direction, and the element reverse surface 102 faces in the z1 direction.

In the present embodiment, the semiconductor device A1 includes four first semiconductor elements 10A and four second semiconductor elements 10B. The numbers of the first semiconductor elements 10A and the second semiconductor elements 10B, however, are not limited to four and an appropriate number can be selected depending on the performance required for the semiconductor device A1. In the example shown in FIG. 9, four first semiconductor elements 10A and four second semiconductor element 10B are disposed. In another example, the number of first semiconductor elements 10A and the number of second semiconductor elements 10B may be two or three or even five or more. An equal or different number of first semiconductor elements 10A and second semiconductor elements 10B may be provided. How many first semiconductor elements 10A and second semiconductor elements 10B are to be provided can be determined according to the current carrying capacity of the semiconductor device A1.

The semiconductor device A1 is configured as a half-bridge switching circuit, for example. In this case, the second semiconductor elements 10B form the upper arm circuit of the semiconductor device A1, and the first semiconductor elements 10A form the lower arm circuit. The second semiconductor elements 10B in the upper arm circuit are connected in parallel, and the first semiconductor elements 10A in the lower arm circuit are connected in parallel. In addition, each second semiconductor element 10B and a relevant first semiconductor element 10A are serially connected to form a bridge layer.

As shown in FIGS. 9 and 17 in particular, the first semiconductor elements 10A are disposed on the conductive substrate 2. In the example shown in FIG. 9, the first semiconductor elements 10A are arranged at spaced intervals in the y direction. Each first semiconductor element 10A is electrically bonded to the conductive substrate 2 (a first conductive part 2A described later) via a conductive bonding material 19. Each first semiconductor element 10A is bonded to the first conductive part 2A with the element reverse surface 102 facing the first conductive part 2A.

As shown in FIGS. 9 and 18 in particular, the second semiconductor elements 10B are disposed on the conductive substrate 2. In the example shown in FIG. 9, the second semiconductor elements 10B are arranged at spaced intervals in the y direction. Each second semiconductor element 10B is electrically bonded to the conductive substrate 2 (a second conductive part 2A described later) via the conductive bonding material 19. Each second semiconductor element 10B is bonded to the second conductive part 2B with the element reverse surface 102 facing the second conductive part 2B. As seen from FIG. 9, the first semiconductor elements 10A and the second semiconductor elements 10B overlap with each other as viewed in the x direction. In another example, however, the first semiconductor elements 10A and the second semiconductor elements 10B may be arranged without such overlap.

Each of the first semiconductor elements 10A and the second semiconductor elements 10B includes a first obverse-surface electrode 11, a second obverse-surface electrode 12, a third obverse-surface electrode 13, and a reverse-surface electrode 15. The description given below of the first obverse-surface electrode 11, the second obverse-surface electrode 12, the third obverse-surface electrode 13, and the reverse-surface electrode 15 is commonly applied to all the first semiconductor element 10A and the second semiconductor elements 10B. The first obverse-surface electrode 11, the second obverse-surface electrode 12, and the third obverse-surface electrode 13 are disposed on the element obverse surface 101. The first obverse-surface electrode 11, the second obverse-surface electrode 12, and the third obverse-surface electrode 13 are insulated from each other by an insulating film not shown in the figures. The reverse-surface electrode 15 is disposed on the element reverse surface 102.

The first obverse-surface electrode 11 may be a gate electrode to which a drive signal (e.g., gate voltage) is inputted for driving the first semiconductor element 10A (the second semiconductor element 10B). The second obverse-surface electrode 12 of the first semiconductor element 10A (the second semiconductor element 10B) may be a source electrode through which a source current flows. The third obverse-surface electrode 13 may be a source sense electrode through which the source current flows. The reverse-surface electrode 15 may be a drain electrode through which a drain current flows. The reverse-surface electrode 15 covers the entire region (or substantially the entire region) of the element reverse surface 102. The reverse-surface electrode may be formed by plating with silver (Ag), for example.

The first semiconductor element 10A (the second semiconductor element 10B) switches between a conducting state and a non-conducting state in response to a drive signal (gate voltage) inputted to the first obverse-surface electrode 11 (the gate electrode). In the conducting state, a current flows from the reverse-surface electrode 15 (the drain electrode) to the second obverse-surface electrode 12 (the source electrode). In the non-conducting state, the current does not flow. In short, the first semiconductor element 10A (the second semiconductor element 10B) performs a switching operation. Through the switching operations of the first semiconductor element 10A and the second semiconductor elements 10B, the semiconductor device A1 converts direct-current voltage applied between the fourth terminal 44 and each of the first terminal 41 and the second terminal 42 into, for example, an alternating-current voltage, and outputs the resulting alternating-current voltage from the third terminals 43.

The semiconductor device A1 includes a thermistor 17 as shown in FIGS. 5 and 9 in particular. The thermistor 17 is used as a temperature sensor.

The conductive substrate 2 supports the first semiconductor elements 10A and the second semiconductor elements 10B. The conductive substrate 2 is bonded to the supporting substrate 3 via a conductive bonding material 29. In plan view, the conductive substrate 2 is rectangular, for example. The conductive substrate 2, together with the first conductive member 5 and the second conductive member 6, forms paths for the main circuit current that is switched by the first semiconductor elements 10A and the second semiconductor elements 10B.

The conductive substrate 2 includes the first conductive part 2A and the second conductive part 2B. Each of the first conductive part 2A and the second conductive part 2B is a plate-like member made of metal. The metal is copper (Cu) or a Cu alloy, for example. The first conductive part 2A and the second conductive part 2B, together with the first terminal 41, the second terminal 42, the third terminals 43, and the fourth terminal 44, form conductive paths leading to the first semiconductor elements 10A and the second semiconductor element 10B. Each of the first conductive part 2A and the second conductive part 2B is bonded to the supporting substrate 3 via the conductive bonding material 29 as shown in FIGS. 12 to 18. The first conductive part 2A has the first semiconductor elements 10A bonded thereto via the conductive bonding material 19. The second conductive part 2B has the second semiconductor elements 10B bonded thereto via the conductive bonding material 19. The conductive bonding materials 19 and 29 are not limited to a specific material and may be solder, a metal paste, or a sintered metal. As shown in FIGS. 3, 9, 12 and 13, the first conductive part 2A and the second conductive part 2B are spaced apart in the x direction. In the illustrated example, the first conductive part 2A is located in the x1 direction from the second conductive part 2B. In plan view, each of the first conductive part 2A and the second conductive part 2B is rectangular, for example. The first conductive part 2A and the second conductive part 2B overlap with each other in the x direction. For example, each of the first conductive part 2A and the second conductive part 2B may have a length of 15 to 25 mm in the x direction, a length of 30 to 40 mm in the y direction, and a length of 1.0 to 5.0 mm (preferably 2.0 mm or so) in the z direction.

The conductive substrate 2 has an obverse surface 201 and a reverse surface 202. As shown in FIGS. 12, 13 and 16 to 18, the obverse surface 201 and the reverse surface 202 are spaced apart in the z direction. The obverse surface 201 faces in the z2 direction, and the reverse surface 202 faces in the z1 direction. The obverse surface 201 is formed by the upper surface of the first conductive part 2A and the upper surface of the second conductive part 2B. The reverse surface 202 is formed by the lower surface of the first conductive part 2A and the lower surface of the second conductive part 2B. The reverse surface 202 faces the supporting substrate 3 and is bonded to the supporting substrate 3.

The supporting substrate 3 supports the conductive substrate 2. The supporting substrate 3 may be made with an active metal brazing (AMB) substrate, for example. The supporting substrate 3 includes an insulating layer 31, a first metal layer 32, and a second metal layer 33.

In one non-limiting example, the insulating layer 31 is made of a ceramic material having a high thermal conductivity. Such ceramic materials include silicon nitride (SiN). In another example, the insulating layer 31 may be made with a sheet of insulating resin, rather than a ceramic material. In plan view, the insulating layer 31 is rectangular, for example.

The first metal layer 32 is formed on the upper surface (the surface facing in the z2 direction) of the insulating layer 31. The first metal layer 32 is made of a material containing Cu, for example. Instead of Cu, the material may contain aluminum (Al). The first metal layer 32 includes a first part 32A and a second part 32B. The first part 32A and the second part 32B are spaced apart in the x direction. The first part 32A is located in the x1 direction from the second part 32B. The first part 32A supports the first conductive part 2A bonded thereto. The second part 32B supports the second conductive part 2B bonded thereto. In plan view, each of the first part 32A and the second part 32B is rectangular, for example.

The second metal layer 33 is formed on the lower surface (the surface facing in the z1 direction) of the insulating layer 31. The second metal layer 33 is made of the same material as the first metal layer 32. In the example shown in FIG. 11, the lower surface (the bottom surface 302 described later) of the second metal layer 33 is exposed from the sealing resin 8. In another example, the lower surface may be covered with the sealing resin 8 and not exposed from the sealing resin 8. In plan view, the second metal layer 33 overlaps with both the first part 32A and the second part 32B.

The supporting substrate 3 has a supporting surface 301 and the bottom surface 302 as shown in FIGS. 12 to 18. The supporting surface 301 and the bottom surface 302 are spaced apart in the z direction. The supporting surface 301 faces in the z2 direction, and the bottom surface 302 faces in the z1 direction. The bottom surface 302 is exposed from the sealing resin 8, as shown in FIG. 11. The supporting surface 301 is the upper surface of the first metal layer 32 and formed by the upper surface of the first part 32A and the upper surface of the second part 32B. The supporting surface 301 faces the conductive substrate 2 and is bonded to the conductive substrate 2. The bottom surface 302 is formed by the lower surface of the second metal layer 33. A heat dissipating member (e.g., heatsink), which is not shown, can be attached to the bottom surface 302. For example, the supporting substrate 3 has a length of 0.7 to 2.0 mm in the z direction (the distance from the supporting surface 301 to the bottom surface 302 measured in the z direction).

Each of the first terminal 41, the second terminal 42, the third terminals 43, and the fourth terminal 44 is made with metal plate. Such a metal plate is made of copper (Cu) or a Cu alloy, for example. In the example shown in FIGS. 1 to 5, 9 and 11, the semiconductor device A1 includes one first terminal 41, one second terminal 42, one fourth terminal 44, and two third terminals 43.

The first terminal 41, the second terminal 42, and the fourth terminal 44 are input terminals for a direct-current voltage that is to be converted. The fourth terminal 44 is a positive electrode (P terminal), and each of the first terminal 41 and the second terminal 42 is a negative electrode (N terminal). The third terminals 43 is an output terminals for alternating-current voltage converted by the first semiconductor elements 10A and the second semiconductor elements 10B. Each of the first terminal 41, the second terminal 42, the third terminals 43, and the fourth terminal 44 has a portion covered with the sealing resin 8 and a portion exposed from the sealing resin 8.

As shown in FIG. 13, the fourth terminal 44 is integrally formed with the second conductive part 2B. In a different configuration, the fourth terminal 44 may be provided as a separate component and electrically bonded to the second conductive part 2B. As shown in FIG. 9 in particular, the fourth terminal 44 is located on the side in the x2 direction with respect to the second semiconductor element 10B and the second conductive part 2B (the conductive substrate 2). The fourth terminal 44 is electrically connected to the second conductive part 2B and the reverse-surface electrodes 15 (the drain electrodes) of the second semiconductor elements 10B via the second conductive part 2B.

As shown in FIG. 9, each of the first terminal 41 and the second terminal 42 is spaced apart from the second conductive part 2B. As shown in FIGS. 5 and 7, the first conductive member 5 is bonded to each of the first terminal 41 and the second terminal 42. As shown in FIGS. 5 and 9 in particular, the first terminal 41 and the second terminal 42 are located on the side in the x2 direction with respect to the second semiconductor elements 10B and the second conductive part 2B (the conductive substrate 2). Each of the first terminal 41 and the second terminal 42 is electrically connected to the first conductive member 5 and the second obverse-surface electrodes 12 (the source electrodes) of the first semiconductor elements 10A via the first conductive member 5.

As shown in FIGS. 1 to 5 and 11 in particular, in the semiconductor device A1, the first terminal 41, the second terminal 42, and the fourth terminal 44 protrude from the sealing resin 8 in the x2 direction. The first terminal 41, the second terminal 42, and the fourth terminal 44 are spaced apart from each other. The first terminal 41 and the second terminal 42 are located on the opposite sides of the fourth terminal 44 in the y direction. The first terminal 41 is located in the y2 direction from the fourth terminal 44, and the second terminal 42 is located in the y1 direction from the fourth terminal 44. The first terminal 41, the second terminal 42, and the fourth terminal 44 overlap with each other as viewed in the y direction.

As seen from FIGS. 9 and 12, each of the two third terminals 43 is integrally formed with the first conductive part 2A. In a different configuration, each third terminal 43 may be provided as a separate component and electrically bonded to the first conductive part 2A. As shown in FIG. 9 in particular, the two third terminals 43 are located on the side in the x1 direction with respect to the first semiconductor elements 10A and the first conductive part 2A (the conductive substrate 2). Each third terminal 43 is electrically connected to the first conductive part 2A and the reverse-surface electrodes 15 (the drain electrodes) of the first semiconductor elements 10A via the first conductive part 2A. Note that the number of the third terminals 43 is not limited to two. For example, three or more third terminals 43 may be provided, or one third terminal 43 may be provided, in which case, the one third terminal 43 is preferably connected to the central portion of the first conductive part 2A in the y direction.

The control terminals 45 are pin-like terminals for controlling the first semiconductor elements 10A and the second semiconductor elements 10B. The control terminals 45 include a plurality of first control terminals 46A to 46D and a plurality of second control terminals 47A to 47E. The first control terminals 46A to 46D are used to control the first semiconductor elements 10A, for example. The second control terminals 47A to 47E are used to control the second semiconductor elements 10B, for example.

The first control terminals 46A to 46D are arranged at spaced intervals in the y direction. As shown in FIGS. 9 and 13 in particular, the first control terminals 46A to 46D are supported by the first conductive part 2A via the control-terminal supporting structure 48 (a first supporting part 48 described later). As shown in FIGS. 5 and 9, the first control terminals 46A to 46D are located in a region between the plurality of first semiconductor elements 10A and the two third terminals 43 in the x direction.

The first control terminal 46A is an input terminal for inputting a drive signal to the first semiconductor elements 10A (a gate terminal). The first control terminal 46A receives a drive signal for driving the first semiconductor elements 10A (e.g., gate voltage).

The first control terminal 46B is a sensing terminal for detecting a source signal of the first semiconductor elements 10A (a source sense terminal). The voltage applied to the second obverse-surface electrode 12 (the source electrode) of each first semiconductor element 10A (the voltage corresponding to the source current) is detected at the first control terminal 46B.

The first control terminals 46C and 46D are electrically connected to a thermistor 17.

The second control terminals 47A to 47E are arranged at spaced intervals in the y direction. As shown in FIGS. 9 and 13 in particular, the second control terminals 47A to 47D are supported by the second conductive part 2B via the control-terminal supporting structure 48 (a second supporting part 48 described later). As shown in FIGS. 5 and 9, the second control terminals 47A to 47E are located in a region between the plurality of second semiconductor elements 10B and the three terminals, namely the first terminal 41, the second terminal 42 and the fourth terminal 44, in the x direction.

The second control terminal 47A is an input terminal for inputting a drive signal to the second semiconductor elements 10B (a gate terminal). The second control terminal 47A receives a drive signal for driving the second semiconductor elements 10B (e.g., gate voltage). The second control terminal 47B is a sensing terminal for detecting a source signal of the second semiconductor elements 10B (a source sense terminal). The voltage applied to the second obverse-surface electrode 12 (the source electrode) of each second semiconductor element 10B (the voltage corresponding to the source current) is detected at the second control terminal 47B. The second control terminals 47C and 47D are electrically connected to a thermistor 17. The second control terminal 47E is a sensing terminal for detecting a drain signal of the second semiconductor elements 10B (a drain sense terminal). The voltage applied to the reverse-surface electrode 15 (the drain electrode) of each second semiconductor element 10B (the voltage corresponding to the drain current) is detected at the second control terminal 47E.

Each of the control terminals 45 (the first control terminals 46A to 46D and the second control terminals 47A to 47E) includes a holder 451 and a metal pin 452.

The holder 451 is made of a conductive material. As shown in FIGS. 14 and 15, the holder 451 is bonded to the control-terminal supporting structure 48 (a first metal layer 482 described later) via a conductive bonding material 459. The holder 451 includes a tubular part, an upper flange, and a lower flange. The upper flange extends from the upper end of the tubular part, and the lower flange from the lower end. The metal pin 452 is inserted into the holder 451 to extend at least from the upper flange to the tubular part. The holder 451 is embedded in the sealing resin 8 (a second projection 852 described later).

The metal pin 452 is a rod-like member extending in the z direction. The metal pin 452 is press-fitted into and supported by the holder 451. The metal pin 452 is electrically connected to the control-terminal supporting structure 48 (the first metal layer 482 described later) at least via the holder 451. As in the example shown in FIGS. 14 and 15, the metal pin 452 inserted into the holder 451 may have the lower end (the end in the z1 direction) in contact with the conductive bonding material 459, in which case, the metal pin 452 is electrically connected to the control-terminal supporting structure 48 also via the conductive bonding material 459.

The control-terminal supporting structure 48 supports the control terminal 45. The control-terminal supporting structure 48 is located between the obverse surface 201 (the conductive substrate 2) and the plurality of control terminals in the z direction.

The control-terminal supporting structure 48 includes a first supporting part 48A and a second supporting part 48B. The first supporting part 48A is disposed on the first conductive part 2A of the conductive substrate 2 and supports the first control terminals 46A to 46D of the plurality of control terminals 45. As shown in FIG. 14, the first supporting part 48A is bonded to the first conductive part 2A via a bonding material 49. The bonding material 49 may be either conductive or insulating. In one example, solder is used as the bonding material 49. The second supporting part 48B is disposed on the second conductive part 2B of the conductive substrate 2 and supports the second control terminals 47A to 47E of the plurality of control terminals 45. As shown in FIG. 15, the second supporting part 48B is bonded to the second conductive part 2B via the bonding material 49.

The control-terminal supporting structure 48 (each of the first supporting part 48A and the second supporting part 48B) may be made with a direct bonded copper (DBC) substrate, for example. The control-terminal supporting structure 48 includes a laminate of an insulating layer 481, a first metal layer 482, and a second metal layer 483.

The insulating layer 481 is made of a ceramic material, for example. In plan view, the insulating layer 481 is rectangular, for example.

As shown in FIGS. 14 and 15 in particular, the first metal layer 482 is formed on the upper surface of the insulating layer 481. Each control terminal 45 stands upright on the first metal layer 482. The first metal layer 482 is made of a Cu or a Cu alloy, for example. As shown in FIG. 9 in particular, the first metal layer 482 includes a first part 482A, a second part 482B, a third part 482C, a fourth part 482D, a fifth part 482E, and a sixth part 482F. The first part 482A, the second part 482B, the third part 482C, the fourth part 482D, the fifth part 482E, and the sixth part 482F are spaced apart from each other to be insulated.

The first part 482A has a plurality of wires 71 bonded thereto. Via the wires 71, the first part 482A is electrically connected to the first obverse-surface electrodes 11 (the gate electrodes) of the first semiconductor elements 10A (the second semiconductor elements 10B). The first part 482A and the sixth part 482F have a plurality of wires 73 connected thereto. Via the wires 71 and 73, the sixth part 482F is electrically connected to the first obverse-surface electrodes 11 (the gate electrodes) of the first semiconductor elements 10A (the second semiconductor elements 10B). As shown in FIG. 9, the first control terminal 46A is bonded to the sixth part 482F of the first supporting part 48A, and the second control terminal 47A is bonded to the sixth part 482F of the second supporting part 48B.

The second part 482B has a plurality of wires 72 bonded thereto. Via the wires 72, the second part 482B is electrically connected to the second obverse-surface electrodes 12 (the source electrodes) of the first semiconductor elements 10A (the second semiconductor elements 10B). As shown in FIG. 9, the first control terminal 46B is bonded to the second part 482B of the first supporting part 48A, and the second control terminal 47B is bonded to the second part 482B of the second supporting part 48B.

The thermistor 17 is bonded to the third part 482C and the fourth part 482D. As shown in FIG. 9, the first control terminals 46C and 46D are bonded to the third part 482C and the fourth part 482D of the first supporting part 48A, and the second control terminals 47C and 47D are bonded to the third part 482C and the fourth part 482D of the second supporting part 48B.

The fifth part 482E of the first supporting part 48A has no electrical connection to any other part. The fifth part 482E of the second supporting part 48B has a wire 74 bonded thereto. Via and is electrically connected to the second conductive part 2B via the wire 74. As shown in FIG. 9, the second control terminal 47E is bonded to the fifth part 482E of the second supporting part 48B. The wires 71 to 74 mentioned above may be bonding wires, for example. The wires 71 to 74 may be made of a material containing gold (Au), Al or Cu, for example.

As shown in FIGS. 14 and 15 in particular, the second metal layer 483 is formed on the lower surface of the insulating layer 481. As shown in FIG. 14, the second metal layer 483 of the first supporting part 48A is bonded to the first conductive part 2A via the bonding material 49. As shown in FIG. 15, the second metal layer 483 of the second supporting part 48B is bonded to the second conductive part 2B via the bonding material 49.

The first conductive member 5 and the second conductive member 6, together with the conductive substrate 2, form paths for the main circuit current that is switched by the first semiconductor elements 10A and the second semiconductor elements 10B. Each of the first conductive member 5 and the second conductive member 6 is spaced apart from the obverse surface 201 (the conductive substrate 2) in the z2 direction and overlaps with the obverse surface 201 in plan view. In the present embodiment, each of the first conductive member and the second conductive member 6 is made with a metal plate. The metal plate is made of Cu or a Cu alloy, for example. Specifically, the first conductive member 5 and the second conductive member 6 are metal plates having been bent as necessary.

The first conductive member 5 is connected to the second obverse-surface electrodes 12 (the source electrodes) of the first semiconductor elements 10A, the first terminal 41, and the second terminal 42, thereby electrically connecting the second obverse-surface electrodes 12 of the first semiconductor elements 10A to the first terminal 41 and the second terminal 42. The first conductive member 5 forms paths for the main circuit current that is switched by the first semiconductor elements 10A. For example, the first conductive member 5 may have a maximum length of 25 to 40 mm in the x direction and a maximum length of 30 to 45 mm in the y direction. As shown in FIGS. 7 and 8, the first conductive member 5 includes a first wiring part 51, a second wiring part 52, a third wiring part 53, a fourth wiring part 54, and a fifth wiring part 55.

The first wiring part 51 includes a first end 511, a second end 512, and a plurality of openings 513. The first end 511 is connected to the first terminal 41. The first end 511 is bonded to the first terminal 41 via a conductive bonding material 59. In plan view, the first wiring part 51 is a strip-shaped part that generally extends in the x direction. The first wiring part 51 overlaps with both the second conductive part 2B and the first conductive part 2A in plan view.

The second end 512 is spaced apart from the first end 511 in the x direction. As shown in FIGS. 7 and 8 in particular, the second end 512 is located in the x1 direction from the first end 511.

In plan view, the openings 513 correspond to locations where the material is locally removed. The openings 513 are spaced apart from each other in the x direction. In the illustrated example, the first wiring part 51 has three openings 513. In plan view, the outermost opening 513 in the x2 direction and the middle opening 513 in the x direction are located in a region that overlaps with the obverse surface 201 of the second conductive part 2B (the conductive substrate 2) but not with the second semiconductor elements 10B. The outermost opening 513 in the x1 direction is located in a region that overlaps with the obverse surface 201 of the first conductive part 2A (the conductive substrate 2) but not with the first semiconductor elements 10A in plan view. The openings 513 are located closer to the end of the second conductive part 2B (the first conductive part 2A) in the y2 direction in plan view. In the present embodiment, the openings 513 are arc-shaped notches recessed in the y2 direction from the edge of the first wiring part 51 in the y1 direction. The plan-view shape of each opening 513 is not specifically limited and may be a notch as in the present embodiment or a hole in a different example.

The second wiring part 52 includes a third end 521, a fourth end 522, and a plurality of openings 523. The third end 521 is connected to the second terminal 42. The third end 521 is bonded to the second terminal 42 via the conductive bonding material 59. In plan view, the second wiring part 52 is a strip-shaped part that generally extends in the x direction. The second wiring part 52 is spaced apart from the first wiring part 51 in the y direction. The second wiring part 52 is located in the y1 direction from the first wiring part 51. The second wiring part 52 overlaps with both the second conductive part 2B and the first conductive part 2A in plan view.

The fourth end 522 is spaced apart from the third end 521 in the x direction. As shown in FIGS. 7 and 8 in particular, the fourth end 522 is located in the x1 direction from the third end 521.

In plan view, the openings 523 correspond to locations where the material is locally removed. The openings 523 are spaced apart from each other in the x direction. In the illustrated example, the second wiring part 52 has three openings 523. In plan view, the outermost opening 523 in the x2 direction and the middle opening 523 in the x direction are located in a region that overlaps with the obverse surface 201 of the second conductive part 2B (the conductive substrate 2) but not with the second semiconductor elements 10B. The outermost opening 523 in the x1 direction is located in a region that overlaps with the obverse surface 201 of the first conductive part 2A (the conductive substrate 2) but not with the first semiconductor elements 10A in plan view. In plan view, the openings 523 are located closer to the end of the second conductive part 2B (the first conductive part 2A) in the y1 direction. In the present embodiment, the openings 523 are arc-shaped notches recessed in the y1 direction from the edge of the second wiring part 52 in the y2 direction. The plan-view shape of each opening 523 is not specifically limited and may be a notch as in the present embodiment or a hole in a different example.

The third wiring part 53 is connected to both the first wiring part 51 (the second end 512) and the second wiring part 52 (the fourth end 522). In plan view, the third wiring part 53 is a strip-shaped part extending in the y direction. As seen from FIG. 7 in particular, the third wiring part 53 overlaps with the first semiconductor element 10A in plan view. As shown in FIG. 17, the third wiring part 53 is connected to the first semiconductor elements 10A.

The third wiring part 53 includes a plurality of recessed regions 531. As shown in FIG. 17 in particular, the recessed regions 531 protrude further in the z1 direction than the rest of the third wiring part 53. Each recessed region 531 is bonded to one of the first semiconductor elements 10A. The recessed regions 531 of the third wiring part 53 are bonded to the second obverse-surface electrodes 12 of the first semiconductor elements 10A via the conductive bonding material 59. The conductive bonding material 59 is not limited to a specific material and may be solder, a metal paste, or a sintered metal. In the present embodiment, each recessed region 531 is formed with an opening 531a. Preferably, each opening 531a overlaps with the central region of a relevant first semiconductor element 10A in plan view. For example, the openings 531a may be through-holes formed in the recessed regions 531 of the third wiring part 53. The openings 531a are used for positioning the first conductive member 5 relative to the conductive substrate 2, for example. In plan view, the openings 531a may have a shape of a perfect circle or other shapes, such as an ellipse or a rectangle.

The fourth wiring part 54 is connected to both the first wiring part 51 and the second wiring part 52. In plan view, the fourth wiring part 54 is a strip-shaped part extending in the y direction. The fourth wiring part 54 is connected to the first wiring part 51 at a location between the first end 511 and the second end 512 and also connected to the second wiring part 52 at a location between the third end 521 and the fourth end 522. The fourth wiring part 54 is spaced apart from the third wiring part 53 in the x direction. As shown in FIGS. 7 and 8 in particular, the fourth wiring part 54 is located in the x2 direction from the third wiring part 53. The fourth wiring part 54 overlaps with the second semiconductor elements 10B in plan view.

The fourth wiring part 54 includes a plurality of projected regions 541. As shown in FIG. 18 in particular, the projected regions 541 protrude further in the z2 direction than the rest of the fourth wiring part 54. As shown in FIGS. 7 and 18 in particular, the projected regions 541 overlap with the second semiconductor elements 10B in plan view. As seen from FIGS. 7 and 8 in particular, in the present embodiment, the locations of the recessed regions 531 of the third wiring part 53 and the locations of the projected regions 541 coincide in the y direction.

The fifth wiring part 55 is connected to both the third wiring part 53 and the fourth wiring part 54. In plan view, the fifth wiring part 55 is a strip-shaped part extending in the x direction. In the present embodiment, the first conductive member 5 includes a plurality of (three) fifth wiring parts 55. The fifth wiring parts 55 are located between the first wiring part 51 and the second wiring part 52 at spaced intervals in the y direction. The fifth wiring part 55 are parallel (or substantially parallel) to each other. The end of each fifth wiring part 55 in the x1 direction is connected to a portion of the third wiring part 53 between two adjacent recessed regions 531 in the y direction. The end of each fifth wiring part 55 in the x2 direction is connected to a portion of the fourth wiring part 54 between two adjacent projected regions 541 in the y direction. Note that FIG. 8 shows imaginary lines indicating boundaries between each fifth wiring part 55 and the third wiring part 53 and between each fifth wiring part 55 and the fourth wiring part 54.

The second conductive member 6 is connected to the second obverse-surface electrodes 12 (the source electrodes) of the second semiconductor elements 10B and the first conductive part 2A, thereby electrically connecting the second obverse-surface electrodes 12 of the second semiconductor elements 10B and the first conductive part 2A. The second conductive member 6 forms paths for the main circuit current that is switched by the second semiconductor elements 10B. As shown in FIGS. 7 and 9, the second conductive member 6 includes a main body 61, a plurality of first connecting ends 62 and a plurality of second connecting ends 63.

In plan view, the main body 61 is a strip-shaped part extending in the y direction and located in a region between the plurality of second semiconductor elements 10B and the first conductive part 2A in the x direction. As shown in FIG. 16 in particular, the main body 61 is located in the z1 direction from the fifth wiring part 55 of the first conductive member 5 and hence closer to the obverse surface 201 (the conductive substrate 2) than the fifth wiring part 55. In plan view, the main body 61 overlaps with the fifth wiring parts 55. In the present embodiment, the main body 61 is formed with a plurality of openings 611 as shown in FIGS. 7, 9, and 13 in particular. The openings 611 may be through-holes extending in the z direction, for example. The openings 611 are arranged at spaced intervals in the y2 direction. In plan view, the openings 611 do not overlap with the fifth wiring part 55. The openings 611 are provided for improving the flow of a melted resin material injected in the process of forming the sealing resin 8. That is, the openings 611 allow the flow of the resin material between the upper region (in the z2 direction) and the lower region (in the z1 direction) around the main body 61 (the second conductive member 6). The shape of the main body 61 (the second conductive member 6) is not limited to this configuration and may be formed without any opening 611.

Each of the first connecting ends 62 and the second connecting ends 63 is connected to the main body 61 and located at a position corresponding to a second semiconductor element 10B. As shown in FIGS. 13 and 18 in particular, each first connecting end 62 is bonded to the second obverse-surface electrode 12 of a relevant second semiconductor element 10B via a conductive bonding material 69, and each second connecting end 63 is bonded to the first conductive part 2A via the conductive bonding material 69. The conductive bonding material 69 is not limited to a specific material and may be solder, a metal paste, or a sintered metal. In the present embodiment, each first connecting end 62 is formed with an opening 621. Preferably, each opening 621 overlaps with the central region of a relevant second semiconductor element 10B in plan view. The openings 621 may be through-holes extending in the z direction, for example. The openings 621 are used for positioning the second conductive member 6 relative to the conductive substrate 2, for example. In plan view, the openings 621 may have a shape of a perfect circle or other shapes, including an ellipse and a rectangle.

The sealing resin 8 covers the first semiconductor elements 10A, the second semiconductor elements 10B, the conductive substrate 2, the supporting substrate 3 (except the bottom surface 302), a portion of each of the first terminal 41, the second terminal 42, the third terminals 43, the fourth terminal 44, and the control terminals 45, the control-terminal supporting structure 48, the first conductive member 5, the second conductive member 6, and the wires 71 to 74. The sealing resin 8 may be made of a black epoxy resin. The sealing resin 8 may be formed by molding, for example. For example, the sealing resin 8 has a length of about 35 to 60 mm in the x direction, a length of about 35 to 50 mm in the y direction, and a length of about 4 to 15 mm in the z direction. These lengths are measured at the largest portions in the respective directions. The sealing resin 8 has a resin obverse surface 81, a resin reverse surface 82, and resin side surfaces 831 to 834.

As shown in FIGS. 10, 12 and 17 in particular, the resin obverse surface 81 and the resin reverse surface 82 are spaced apart in the z direction. The resin obverse surface 81 faces in the z2 direction, and the reverse surface 82 faces in the z1 direction. The control terminals 45 (the first control terminals 46A to 46D and the second control terminals 47A to 47E) protrude from the resin obverse surface 81. As shown in FIG. 11, the resin reverse surface 82 has the shape of a frame surrounding the bottom surface 302 (the lower surface of the second metal layer 33) of the supporting substrate 3 in plan view. The bottom surface 302 of the supporting substrate 3 is exposed on the resin reverse surface 82 and is flush with the resin reverse surface 82, for example. Each of the resin side surfaces 831 to 834 is connected to both the resin obverse surface 81 and the resin reverse surface 82 and located between them in the z direction. As shown in FIG. 4 in particular, the resin side surfaces 831 and 832 are spaced apart in the x direction. The resin side surface 831 faces in the x1 direction, and the resin side surface 832 faces in the x2 direction. The two third terminals 43 protrude from the resin side surface 831, whereas the first terminal 41, the second terminal 42 and the fourth terminal 44 protrude from the resin side surface 832. As shown in FIG. 4 in particular, the resin side surfaces 833 and 834 are spaced apart in the y direction. The resin side surface 833 faces in the y1 direction, and the resin side surface 834 faces in the y2 direction.

As shown in FIG. 4, the resin side surface 832 is formed with a plurality of recesses 832a. Each recess 832a is recessed in the x direction in plan view. The recesses 832a include one formed between the first terminal 41 and the fourth terminal 44, and one formed between the second terminal 42 and the fourth terminal 44. The recesses 832a are provided to increase the creepage distance along the resin side surface 832 between the first terminal 41 and the fourth terminal 44 and also between the second terminal 42 and the fourth terminal 44.

As shown in FIGS. 12 and 13 in particular, the sealing resin 8 includes a plurality of first projections 851, a plurality of second projections 852, and a resin cavity 86.

The first projections 851 protrude from the resin obverse surface 81 in the z direction. The first projections 851 are located at or near the four corners of the sealing resin 8 in plan view. Each first projection 851 has a first-projection end surface 851*a* at its end (the end in the z2 direction). The first-projection end surfaces 851*a* of the first projections 851 all lie in the same plane (x-y plane) and parallel (or sub-stantially parallel) to the resin obverse surface 81. Each first projection 851 has the shape of a truncated hollow cone with a bottom, for example. The first projections 851 serve as spacers when the semiconductor device A1 is mounted on, for example, a control circuit board of a device that operates on power generated by the semiconductor device A1. Each first projection 851 has a recess 851*b* and an inner wall 851*c* defining the recess 851*b*. Each first projection 851 is a columnar structure, which preferably is a cylindrical col-umn. Preferably, the recess 851*b* has a cylindrical shape, and the inner wall 851*c* defines one perfect circle in plan view.

The semiconductor device A1 may be mechanically fas-tened to the control circuit board or the like by one or more screws, for example. For this purpose, each first projection 851 may be provided with an internal thread on the inner wall 851*c* of the recess 851*b*. For example, an insert nut may be inserted into the recess 851*b* of each first projection 851.

As shown in FIG. 13 in particular, the second projections 852 protrude from the resin obverse surface 81 in the z direction. The second projections 852 overlap with the control terminals 45 in plan view. The metal pin 452 of each control terminal 45 protrudes out through a relevant second projection 852. Each second projection 852 has the shape of a truncated cone. Each second projection 852 covers the holder 451 and a portion of the metal pin 452 of a relevant control terminal 45.

As shown in FIG. 12, each resin cavity 86 extends in the z direction from the resin obverse surface 81 to the obverse surface 201 of the conductive substrate 2. Each resin cavity 86 is tapered from the resin obverse surface 81 to the obverse surface 201, so that the cross section orthogonal to the z direction is gradually smaller. The resin cavities 86 are holes in the sealing resin 8 and formed at the time of molding the sealing resin 8.

Although the process is not illustrated in the figures, the resin cavities 86 are formed as a result that the spaces occupied by the pressing members used to apply pressing force to the obverse surface 201 of the conductive substrate 2 during the molding of the sealing resin 8 are not filled with a melted resin material injected to form the sealing resin 8. The pressing members are inserted through the openings 513 and 523 of the first conductive member 5. In this way, the pressing members can press the conductive substrate 2 without interfering with the first conductive member 5, while preventing warping of the supporting substrate 3 to which the conductive substrate 2 is bonded.

As shown in FIG. 12, the semiconductor device A1 of the present embodiment includes resin filled parts 88. The resin filled parts 88 are formed by filling the resin cavities 86 with a resin material. The resin filled part 88 may be made of the same epoxy resin as that forming the sealing resin 8 or a different resin material.

Next, the effects of the present embodiment will be described.

The semiconductor device A1 includes the plurality of first semiconductor elements 10A, the conductive substrate 2, and the first conductive member 5. Each first semiconductor element 10A has a switching function and is bonded to the conductive substrate 2. The first conductive member 5 forms path for the main circuit current that is switched by the first semiconductor elements 10A. The first conductive member includes the first wiring part 51, the second wiring part 52, the third wiring part 53, the fourth wiring part 54, and the fifth wiring parts 55. The first wiring part 51 and the second wiring part 52 extend in the x direction and are spaced apart from each other in the y direction. Each of the third wiring part 53 and the fourth wiring part 54 is con-nected to both the first wiring part 51 and the second wiring part 52 and extends in the y direction. The third wiring part 53 and the fourth wiring part 54 are spaced apart from each other in the x direction. The third wiring part 53 is connected to the first semiconductor elements 10A. Each fifth wiring part 55 is located between the first wiring part 51 and the second wiring part 52 in the y direction and connected to both the third wiring part 53 and the fourth wiring part 54.

The first conductive member 5 of this configuration forms a grid of current paths with the first wiring part 51, the second wiring part 52, the third wiring part 53, the fourth wiring part 54, and the fifth wiring parts 55 crossing each other vertically and horizontally in plan view. In this way, the first conductive member 5 having a relatively large area in plan view can be provided under the constraints imposed by other components of the semiconductor device A1. The semiconductor device A1 thus provides the distributed, large-area current paths for the main circuit current that flows from the first semiconductor elements 10A into the first conductive member 5 via the third wiring part 53. The semiconductor device A1 therefore has a desirable configu-ration for carrying a large electric current.

The third wiring part 53 includes the plurality of recessed regions 531. The recessed regions 531 protrude in the z1 direction. Each recessed region 531 is bonded to a first semiconductor element 10A. With this configuration, the third wiring part 53 (the first conductive member 5) is allowed to have a large area in a developed state, while ensuring appropriate electrical connections between the third wiring part 53 (the first conductive member 5) and the first semiconductor elements 10A. The semiconductor device A1 therefore has a more desirable configuration for carrying a large electric current.

The fourth wiring part 54 includes the plurality of pro-jected regions 541. The projected regions 541 protrude in the z2 direction. The locations of the projected regions 541 coincide with the locations of the recessed regions 531 of the third wiring part 53 in the y direction. With this configura-tion, the third wiring part 53 and the fourth wiring part 54 may have an approximately equal length in a developed state in the y direction. This is desirable for preventing distortion of the fourth wiring part 54. Although the semiconductor device A1 includes the first conductive member having the recessed regions 531 in the third wiring part 53 and the projected regions 541 in the fourth wiring part 54, the fourth wiring part 54 may be formed without the projected regions 541 unlike the present embodiment. Depending on the shape of bends (the recessed regions 531) of the third wiring part 53, the distortion can be prevented without the projected regions 541 in the fourth wiring part 54.

In the present embodiment, the first conductive member 5 includes the plurality of fifth wiring part 55. The fifth wiring parts 55 are arranged at spaced intervals in the y direction and extend in the x direction. With this configuration, the first conductive member 5 forms a grid pattern and has a larger area in plan view. The semiconductor device A1 therefore has a more desirable confabulation for carrying a large electric current.

The conductive substrate 2 includes the first conductive part 2A and the second conductive part 2B. The plurality of second semiconductor elements 10B and the second conductive member 6 are included in the semiconductor device A1. The second semiconductor elements 10B having a switching function are bonded to the second conductive part 2B. The second conductive member 6 is connected to the second semiconductor elements 10B and the first conductive part 2A, forming paths for the main circuit current that is switched by the second semiconductor elements 10B The second conductive member 6 (the main body 61) overlaps with the fifth wiring parts 55 in plan view. The semiconductor device A1 of this configuration is desirable for reducing the inductance and for carrying a large current.

The fourth wiring part 54 of the first conductive member overlaps with the second semiconductor elements 10B in plan view. Specifically, the projected regions 541 of the fourth wiring part 54 overlap with the second semiconductor elements 10B in plan view. As shown in FIG. 18 in particular, although the second semiconductor elements 10B have regions bonded to the second conductive member 6 (the first connecting ends 62), the fourth wiring part 54 of this configurations can be disposed without contact with the second conductive member 6 (the first connecting ends 62).

Figure 19:
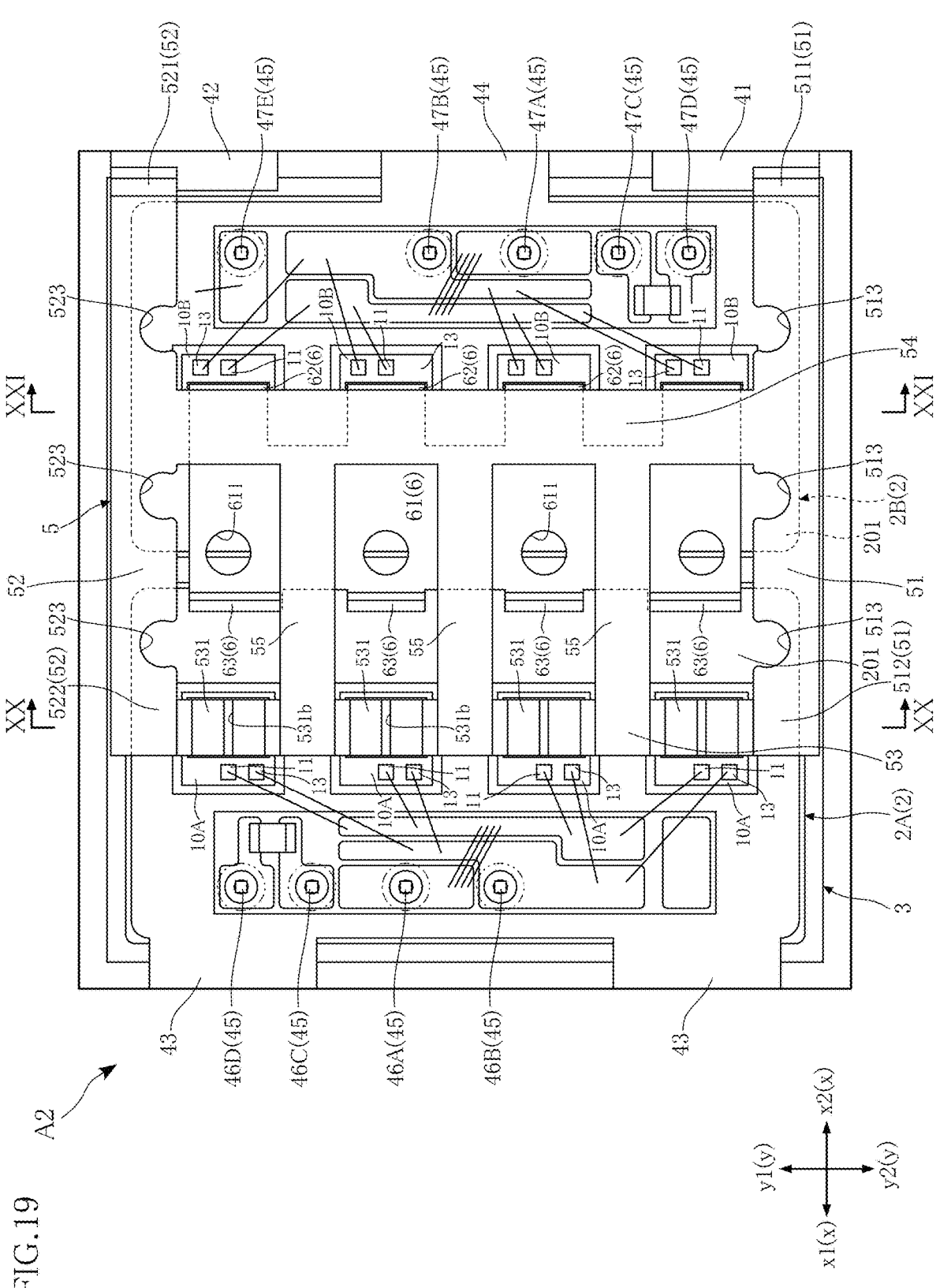
FIG. 19 is a plan view, similar to FIG. 7 (with the sealing resin omitted), of a semiconductor device according to a variation of the first embodiment.
Figure 20:
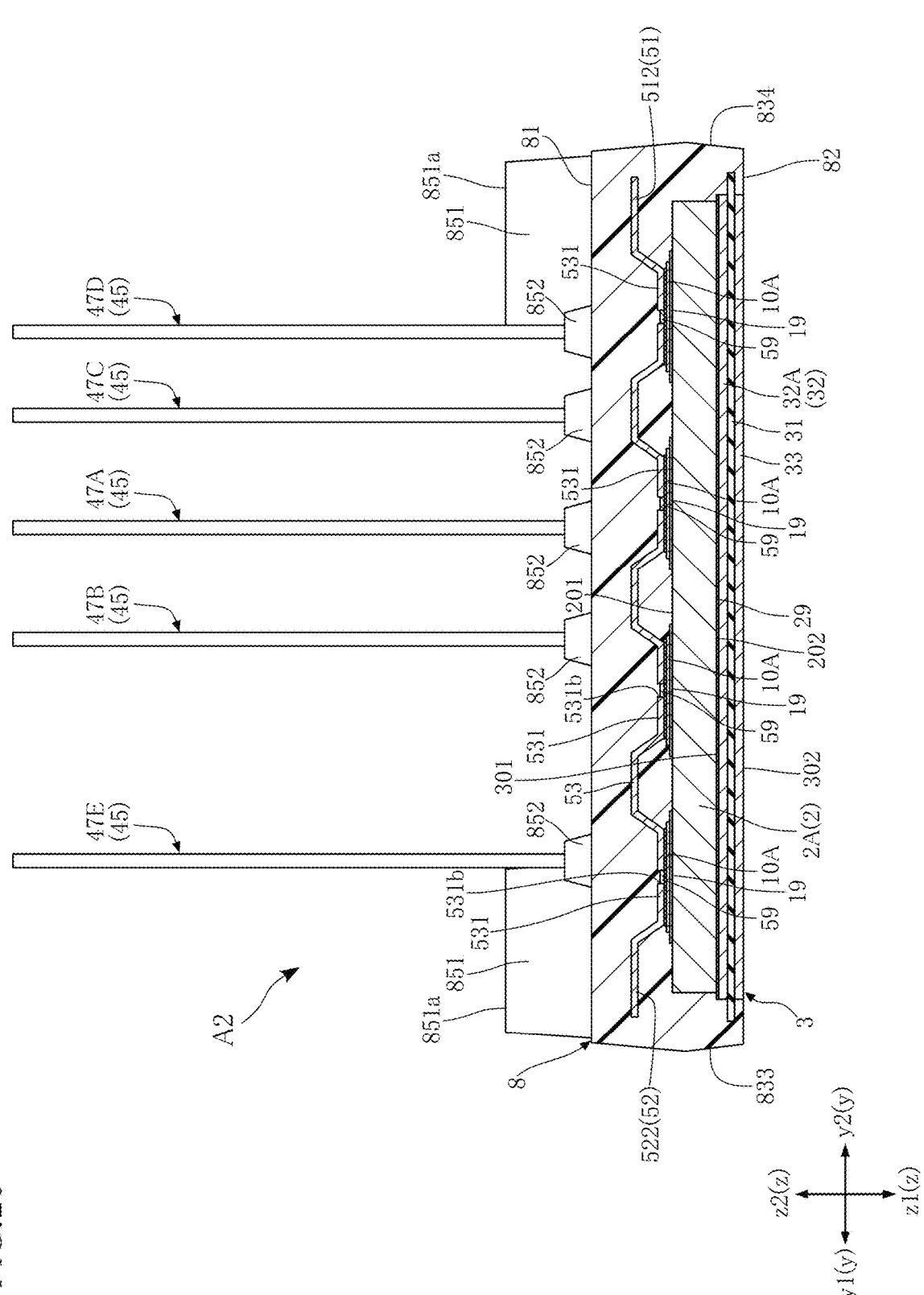
FIG. 20 is a sectional view taken along line XX-XX in FIG. 19.
Figure 21:
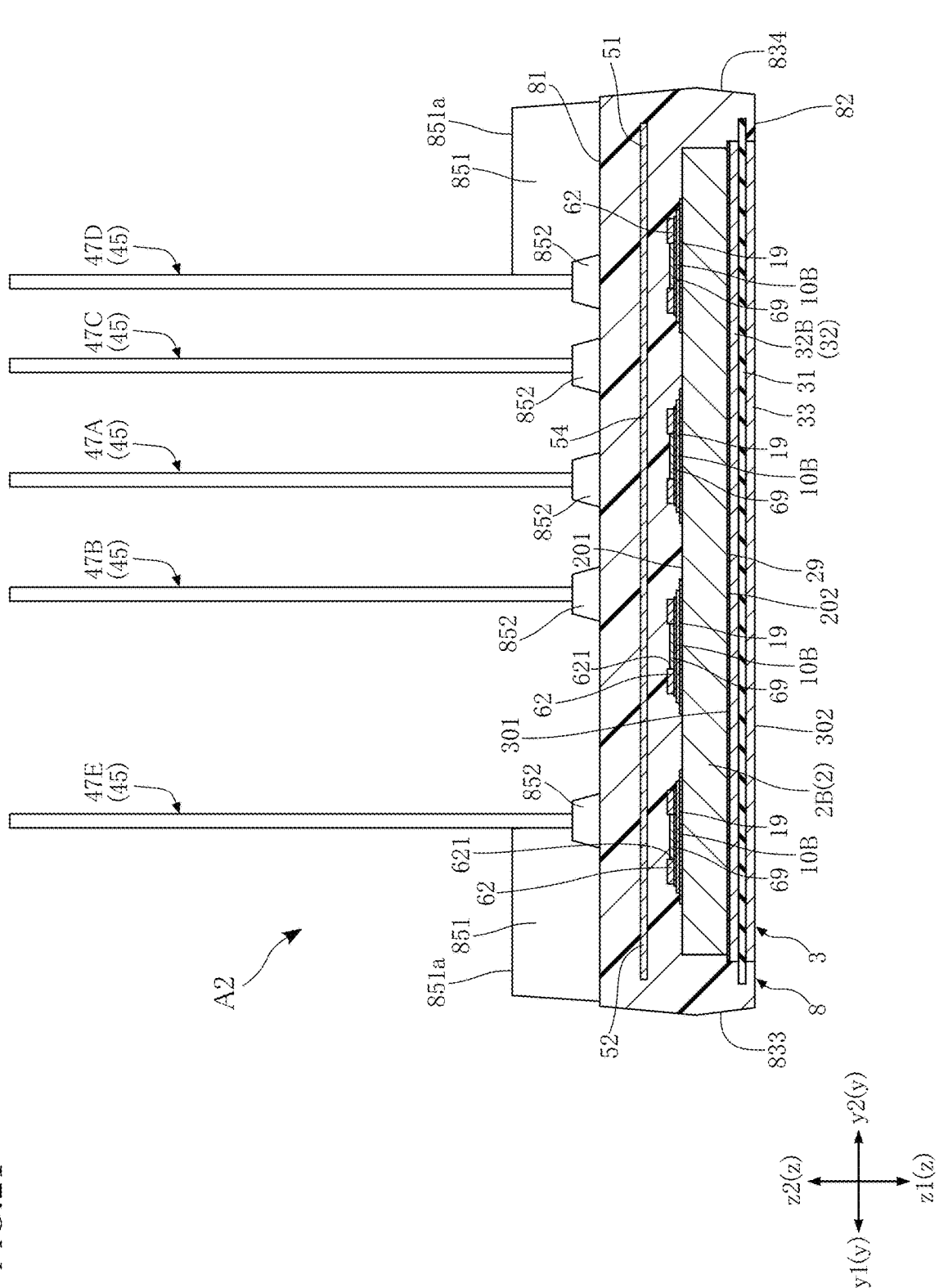
FIG. 21 is a sectional view taken along line XXI-XXI in FIG. 19.

FIG. 19 shows a semiconductor device according to a variation of the first embodiment. FIG. 19 is a plan view corresponds to FIG. 7 of the embodiment described above. FIG. is a sectional view taken along line XX-XX in FIG. 19. FIG. 21 is a sectional view taken along line XXI-XXI in FIG. 19. Note that, in FIGS. 19 to 21, components that are identical or similar to those of the semiconductor device A1 of the above-described embodiment are given the same reference numerals as those in the above-described embodiment, and descriptions of such components may be omitted.

A semiconductor device A2 of this variation differs from the above-described embodiment in the configuration of the first conductive member 5, specifically in the configurations of the third wiring part 53 and the fourth wiring part 54. The third wiring part 53 of this variation has a slit 531b formed in each recessed region 531. As shown in FIGS. 19 and 20, the slit 531b extends in the x direction at the middle of the recessed region 531 in the y direction. Hence, the recessed region 531 is composed of two separate sub-regions across the slit 531b in the y direction. In contrast to the above-described embodiment, the fourth wiring part 54 includes no bends and thus includes no projected regions 541 as shown in FIGS. 19 and 21. That is, the entire fourth wiring part 54 is the same distance away from the obverse surface 201 of the second conductive part 2B in the z direction.

The first conductive member 5 of the semiconductor device A2 forms a grid of current paths with the first wiring part 51, the second wiring part 52, the third wiring part 53, the fourth wiring part 54, and the fifth wiring parts 55 crossing each other vertically and horizontally in plan view. In this way, the first conductive member 5 having a relatively large area in plan view is provided under the constraints imposed by other components of the semiconductor device A2. The semiconductor device A2 thus provides the distributed, large-area current paths for the main circuit current that flows from the first semiconductor elements 10A into the first conductive member 5 via the third wiring part 53. The semiconductor device A2 therefore has a desirable configuration for carrying a large electric current.

The third wiring part 53 includes the recessed regions 531 each formed with a slit 531b extending in the x direction. The fourth wiring part 54 is flat without bends. With this configuration, the third wiring part 53 and the fourth wiring part 54 may have an approximately equal length in a developed state in the y direction. This configuration is desirable for preventing distortion of the fourth wiring part 54. Unlike this variation in which a slit 531b is formed in each of the recessed regions 531, a slit 531b may be formed in at least one recessed region 531 selected from the recessed regions 531. These variations of the above-described embodiment achieve the same effect as the semiconductor device A1 as to the configuration in common with the semiconductor device A1.

The semiconductor devices according to the present disclosure are not limited to the embodiments described above. Various design changes can be made to the specific configuration of each part of a semiconductor device according to the present disclosure.

The present disclosure includes the embodiments described in the following clauses.

Clause 1

A semiconductor device comprising:
a conductive substrate including an obverse surface facing in a first sense of a thickness direction and a reverse surface facing away from the obverse surface;
a plurality of first semiconductor elements bonded to the obverse surface and having a switching function; and
a first conductive member forming a path for a main circuit current that is switched by the plurality of first semiconductor elements,
wherein the first conductive member includes a first wiring part, a second wiring part, a third wiring part, a fourth wiring part, and a fifth wiring part,
the first wiring part extends in a first direction orthogonal to the thickness direction,
the second wiring part is spaced apart from the first wiring part in a second direction orthogonal to both the thickness direction and the first direction and extends in the first direction,
the third wiring part is connected to both the first wiring part and the second wiring part and extends in the second direction,
the fourth wiring part is spaced apart from the third wiring part in the first direction, is connected to both the first wiring part and the second wiring part, and extends in the second direction,
the fifth wiring part is located between the first wiring part and the second wiring part in the second direction and is connected to both the third wiring part and the fourth wiring part, and
the third wiring part is connected to the plurality of first semiconductor elements.

Clause 2

The semiconductor device according to Clause 1, wherein the first conductive member is made with a metal plate.

Clause 3

The semiconductor device according to Clause 2, wherein the third wiring part includes a plurality of recessed regions protruding in a second sense of the thickness direction, and each of the plurality of recessed regions is bonded to one of the plurality of first semiconductor elements.

Clause 4

The semiconductor device according to Clause 3, wherein the fourth wiring part includes a plurality of projected regions protruding in the first sense of the thickness direction.

Clause 5

The semiconductor device according to Clause 4, wherein the plurality of recessed regions and the plurality of projected regions coincide in position in the second direction.

Clause 6

The semiconductor device according to Clause 3, wherein at least one of the plurality of recessed regions includes a slit extending in the first direction.

Clause 7

The semiconductor device according to Clause 3, wherein the conductive substrate includes a first conductive part and a second conductive part spaced apart from each other in the first direction, and the plurality of first semiconductor elements are electrically bonded to the first conductive part.

Clause 8

The semiconductor device according to Clause 7, further comprising:

a plurality of second semiconductor elements electrically bonded to the second conductive part and having a switching function; and a second conductive member connected to the plurality of second semiconductor elements and the first conductive part and made with a metal plate.

Clause 9

The semiconductor device according to Clause 8, wherein the fourth wiring part overlaps with the plurality of second semiconductor elements as viewed in the thickness direction.

Clause 10

The semiconductor device according to Clause 9, wherein the fourth wiring part includes a plurality of projected regions protruding in the first sense of the thickness direction, and the plurality of projected regions and the plurality of second semiconductor elements overlap with each other as viewed in the thickness direction.

Clause 11

The semiconductor device according to Clause 8 or 9, wherein at least one of the plurality of recessed regions includes a slit extending in the first direction.

Clause 12

The semiconductor device according to any one of Clauses 8 to 11, further comprising:

a first terminal located on a side in a first sense of the first direction with respect to the second conductive part and connected to the first wiring part;

a second terminal located on the side in the first sense of the first direction with respect to the second conductive part and connected to the second wiring part;

a third terminal connected to the first conductive part; and a fourth terminal connected to the second conductive part.

Clause 13

The semiconductor device according to Clause 12, wherein the first terminal, the second terminal, and the fourth terminal overlap with each other as viewed in the second direction.

Clause 14

The semiconductor device according to any one of Clauses 8 to 13, wherein the second conductive member overlaps with the fifth wiring part as viewed in the thickness direction.

Clause 15

The semiconductor device according to any one of Clauses 8 to 14, wherein the plurality of first semiconductor elements and the plurality of second semiconductor elements overlap with each other as viewed in the first direction.

Clause 16

The semiconductor device according to any one of Clauses 2 to 15, wherein the first conductive member contains copper.

Clause 17

The semiconductor device according to any one of Clauses 1 to 16, wherein the fifth wiring part includes a plurality of wiring parts spaced apart from each other in the second direction, each of the plurality of wiring parts extending in the first direction.

Reference Numerals

A1, A2: Semiconductor device
10A: First semiconductor element
10B: Second semiconductor element
101: Element obverse surface
102: Element reverse surface
11: First obverse-surface electrode
12: Second obverse-surface electrode
13: Third obverse-surface electrode -continued

| Reference Numerals | | |
|---|---|---|
| 15: Reverse-surface electrode | 17: Thermistor | |
| 19: Conductive bonding material | 2: Conductive substrate | |
| 2A: First conductive part | 2B: Second conductive part | |
| 201: Obverse surface | 202: Reverse surface | |
| 29: Conductive bonding material | 3: Supporting substrate | |
| 301: Supporting surface | 302: Bottom surface | |
| 31: Insulating layer | 32: First metal layer | |
| 32A: First part | 32B: Second part | 321: First bonding layer |
| 33: Second metal layer | 41: First terminal | |
| 42: Second terminal | 43: Third terminal | |
| 44: Fourth terminal | 45: Control terminal | |
| 451: Holder | 452: Metal pin | |
| 459: Conductive bonding material | | |
| 46A, 46B, 46C, 46D: First control terminal | | |
| 47A, 47B, 47C, 47D, 47E: Second control terminal | | |
| 48: Control-terminal supporting structure | | |
| 481: Insulating layer | 482: First metal layer | |
| 482A: First part | 482B: Second part | 482C: Third part |
| 482D: Fourth part | 482E: Fifth part | 482F: Sixth part |
| 483: Second metal layer | 49: Bonding material | |
| 5: First conductive member | 51: First wiring part | |
| 511: First end | 512: Second end | |
| 513: Opening | 52: Second wiring part | 521: Third end |
| 522: Fourth end | 53: Third wiring part | 531 : Recessed region |
| 531a: Opening | 531b: Slit | 54: Fourth wiring part |
| 541: Projected region | 55: Fifth wiring part | |
| 59: Conductive bonding material | | |
| 6: Second conductive member | 61: Main body | 611: Opening |
| 62: First connecting end | 621: Opening | |
| 63: Second connecting end | 69: Conductive bonding material | |
| 71, 72, 73, 74: Wire | 8: Sealing resin | |
| 81: Resin obverse surface | 82: Resin reverse surface | |
| 831, 832: Resin side surface | 832a: Recess | |
| 833, 834: Resin side surface | 851: First projection | |
| 851a: First-projection end surface | 851b: Recess | |
| 851c: Inner wall | 852: Second projection | |
| 86: Resin cavity | 88: Resin filled part | |

The invention claimed is:

1. A semiconductor device comprising:
   a conductive substrate including an obverse surface facing in a first sense of a thickness direction and a reverse surface facing away from the obverse surface;
   a plurality of first semiconductor elements bonded to the obverse surface and having a switching function; and
   a first conductive member forming a path for a main circuit current that is switched by the plurality of first semiconductor elements,
   wherein the first conductive member includes a first wiring part, a second wiring part, a third wiring part, a fourth wiring part, and a fifth wiring part,
   the first wiring part extends in a first direction orthogonal to the thickness direction,
   the second wiring part is spaced apart from the first wiring part in a second direction orthogonal to both the thickness direction and the first direction and extends in the first direction,
   the third wiring part is connected to both the first wiring part and the second wiring part and extends in the second direction,
   the fourth wiring part is spaced apart from the third wiring part in the first direction, is connected to both the first wiring part and the second wiring part, and extends in the second direction,
   the fifth wiring part is located between the first wiring part and the second wiring part in the second direction and is connected to both the third wiring part and the fourth wiring part, and the third wiring part is connected to the plurality of first semiconductor elements.

2. The semiconductor device according to claim 1, wherein the first conductive member is made with a metal plate.

3. The semiconductor device according to claim 2, wherein the third wiring part includes a plurality of recessed regions protruding in a second sense of the thickness direction, and
   each of the plurality of recessed regions is bonded to one of the plurality of first semiconductor elements.

4. The semiconductor device according to claim 3, wherein the fourth wiring part includes a plurality of projected regions protruding in the first sense of the thickness direction.

5. The semiconductor device according to claim 4, wherein the plurality of recessed regions and the plurality of projected regions coincide in position in the second direction.

6. The semiconductor device according to claim 3, wherein at least one of the plurality of recessed regions includes a slit extending in the first direction.

7. The semiconductor device according to claim 3, wherein the conductive substrate includes a first conductive part and a second conductive part spaced apart from each other in the first direction, and
   the plurality of first semiconductor elements are electrically bonded to the first conductive part.

8. The semiconductor device according to claim 7, further comprising:

a plurality of second semiconductor elements electrically bonded to the second conductive part and having a switching function; and a second conductive member connected to the plurality of second semiconductor elements and the first conductive part and made with a metal plate.

9. The semiconductor device according to claim 8, wherein the fourth wiring part overlaps with the plurality of second semiconductor elements as viewed in the thickness direction.

10. The semiconductor device according to claim 9, wherein the fourth wiring part includes a plurality of projected regions protruding in the first sense of the thickness direction, and the plurality of projected regions and the plurality of second semiconductor elements overlap with each other as viewed in the thickness direction.

11. The semiconductor device according to claim 8, wherein at least one of the plurality of recessed regions includes a slit extending in the first direction.

12. The semiconductor device according to claim 8, further comprising:

a first terminal located on a side in a first sense of the first direction with respect to the second conductive part and connected to the first wiring part;

a second terminal located on the side in the first sense of the first direction with respect to the second conductive part and connected to the second wiring part;

a third terminal connected to the first conductive part; and a fourth terminal connected to the second conductive part.

13. The semiconductor device according to claim 12, wherein the first terminal, the second terminal, and the fourth terminal overlap with each other as viewed in the second direction.

14. The semiconductor device according to claim 8, wherein the second conductive member overlaps with the fifth wiring part as viewed in the thickness direction.

15. The semiconductor device according to claim 8, wherein the plurality of first semiconductor elements and the plurality of second semiconductor elements overlap with each other as viewed in the first direction.

16. The semiconductor device according to claim 2, wherein the first conductive member contains copper.

17. The semiconductor device according to claim 1, wherein the fifth wiring part includes a plurality of wiring parts spaced apart from each other in the second direction, each of the plurality of wiring parts extending in the first direction.

* * * * *